(12) United States Patent
Tanabe

(10) Patent No.: US 10,890,842 B2
(45) Date of Patent: Jan. 12, 2021

(54) REFLECTIVE MASK BLANK, REFLECTIVE MASK, AND PROCESS FOR PRODUCING REFLECTIVE MASK BLANK

(71) Applicant: AGC INC., Chiyoda-ku (JP)

(72) Inventor: Hiroyoshi Tanabe, Tokyo (JP)

(73) Assignee: AGC INC., Chiyoda-ku (JP)

( * ) Notice: Subject to any disclaimer, the term of this patent is extended or adjusted under 35 U.S.C. 154(b) by 197 days.

(21) Appl. No.: 16/131,560

(22) Filed: Sep. 14, 2018

(65) Prior Publication Data

US 2019/0086791 A1   Mar. 21, 2019

(30) Foreign Application Priority Data

Sep. 21, 2017 (JP) .................. 2017-181785
Jun. 13, 2018 (JP) .................. 2018-112600

(51) Int. Cl.
  *G03F 1/24* (2012.01)
  *G03F 1/54* (2012.01)

(52) U.S. Cl.
  CPC . *G03F 1/24* (2013.01); *G03F 1/54* (2013.01)

(58) Field of Classification Search
  CPC .................... G03F 1/24; G03F 1/54
  USPC ....................................... 430/5
  See application file for complete search history.

(56) References Cited

U.S. PATENT DOCUMENTS

| 9,581,889 | B2 * | 2/2017 | Hassan | ............ C23C 16/44 |
| 2007/0128528 | A1 * | 6/2007 | Hess | ............ B82Y 10/00 |
| | | | | 430/5 |
| 2009/0011341 | A1 | 1/2009 | Hayashi et al. | |
| 2011/0281207 | A1 | 11/2011 | Hosoya | |
| 2012/0107733 | A1 * | 5/2012 | Hayashi | ............ B82Y 40/00 |
| | | | | 430/5 |
| 2018/0031964 | A1 * | 2/2018 | Jindal | ............ G03F 1/60 |
| 2019/0384156 | A1 * | 12/2019 | Tanabe | ............ G03F 1/48 |

FOREIGN PATENT DOCUMENTS

| JP | 2007-273678 | 10/2007 |
| KR | 10-2008-0113422 A | 12/2008 |
| KR | 10-2012-0057551 A | 6/2012 |
| KR | 10-2016-0002332 A | 1/2016 |

\* cited by examiner

*Primary Examiner* — Amanda C. Walke
(74) *Attorney, Agent, or Firm* — Obion, McClelland, Maier & Neustadt, L.L.P.

(57) ABSTRACT

A reflective mask blank includes, on/above a substrate in the following order from the substrate side, a reflective layer which reflects EUV light, and an absorber layer which absorbs EUV light. The absorber layer contains Sn as a main component and Ta in an amount of 25 at % or more.

19 Claims, 10 Drawing Sheets

REFLECTIVE MASK BLANK, REFLECTIVE MASK, AND PROCESS FOR PRODUCING REFLECTIVE MASK BLANK

BACKGROUND OF THE INVENTION

Technical Field

The present invention relates to a reflective mask blank, a reflective mask, and a process for producing the reflective mask blank.

Background Art

In recent years, with the progress of microfabrication of integrated circuits for constituting semiconductor devices, extreme ultra violet (hereinafter referred to as "EUV") lithography is being investigated as an exposure technique which replaces the conventional exposure technique employing visible light or ultraviolet light (wavelengths: 365 to 193 nm) or employing ArF excimer laser light (wavelength: 193 nm).

In the EUV lithography, EUV light which has a shorter wavelength than ArF excimer laser light is used as light source for exposure light. The term "EUV light" means light having a wavelength in a soft X-ray region or vacuum ultraviolet region, and more specifically means light having a wavelength of about 0.2 to 100 nm. For example, EUV light having a wavelength of about 13.5 nm is used.

EUV light is easy to be absorbed by many substances, and thus, refractive optical systems used in conventional exposure techniques cannot be used. Because of this, a reflective optical system composed of a reflective mask and mirrors is used in EUV lithography. In EUV lithography, a reflective mask is used as a mask for pattern transfer.

A reflective mask includes a substrate, a reflective layer formed thereon, and an absorber layer formed on the reflective layer in a pattern, the reflective layer reflecting EUV light and the absorber layer absorbing the EUV light. The reflective mask is obtained by using a reflective mask blank configured by laminating a reflective layer and an absorber layer in this order on/above a substrate, and by removing a part of the absorber layer to form a given pattern and then cleaning this reflective mask blank with a cleaning liquid.

The EUV light which enters the reflective mask is partly absorbed by the absorber layer and the remaining portion of the EUV light is reflected by the reflective layer. The reflected EUV light forms an image on the surface of an exposure material (a wafer coated with a resist) by an optical system. Thus, the pattern of the absorber layer is transferred to the surface of the exposure material.

In EUV lithography, EUV light usually enters a reflective mask from a direction inclined at an angle of about 6° and is reflected obliquely at a similar angle. Because of this, when the absorber layer has too large thickness, there is a possibility that the optical path of the EUV light is intercepted (shadowing). In the case where a shadow of the absorber layer is cast on the substrate or the like because of the shadowing, there is a possibility that the pattern of the reflective mask is not faithfully transferred to the surface of the exposure material, resulting in impaired pattern accuracy. Meanwhile, the reduction of the thickness of the absorber layer results in a decrease in the shielding properties of the EUV light by the reflective mask and an increase in EUV light reflectance. There is hence a possibility that the contrast between the patterned portion and other portion in the reflective mask decreases.

Investigations have hence been made on reflective mask blanks capable of giving a reflective mask in which the pattern thereof can be faithfully transferred to the surface of the exposure material, and at the same time, the decrease in contrast can be diminished. For example, Patent Document 1 describes a reflective mask blank including an absorber film including a material which includes Ta in an amount of 50 atomic percent (at %) or more as a main component and further contains at least one element selected from Te, Sb, Pt, I, Bi, Ir, Os, W, Re, Sn, In, Po, Fe, Au, Hg, Ga, and Al.

However, in the reflective mask blank described in Patent Document 1, no investigation has been made on whether the absorber film has resistance to the cleaning liquid (cleaning resistance) during the production of a reflective mask. There is hence a possibility that a pattern cannot be stably formed in the absorber film.

Patent Document 1: JP-A-2007-273678

SUMMARY OF THE INVENTION

In an aspect of the present invention, an object thereof is to provide a reflective mask blank including an absorber layer which shows excellent cleaning resistance during the production of a reflective mask therefrom.

A reflective mask blank in an aspect of the present invention includes, on/above a substrate in the following order from the substrate side: a reflective layer which reflects EUV light; and an absorber layer which absorbs EUV light, and the absorber layer contains Sn as a main component and Ta in an amount of 25 at % or more.

According to an aspect of the present invention, it is possible to provide a reflective mask blank including an absorber layer which shows excellent cleaning resistance during the production of a reflective mask therefrom.

DETAILED DESCRIPTION OF THE INVENTION

Embodiments of the present invention are described below in detail. The dimensional proportions between the members in a drawing may be different from the actual ones for the purpose of easy understanding. In this specification, a three-dimensional rectangular coordinate system involving three axial directions (X axis direction, Y axis direction, and Z axis direction) is used, and the coordinates on a main surface of a glass substrate are taken as X axis direction and Y axis direction, and the height direction (thickness direction) is taken as Z axis direction. The direction extending upward from below the glass substrate (i.e., the direction extending from the main surface of the glass substrate toward the reflective layer) is taken as +Z axis direction, and the direction opposite thereto is taken as −Z axis direction. In the following descriptions, the +Z axis direction may be referred to as "upside" and the −Z axis direction may be referred to as "downside".

First Embodiment

<Reflective Mask Blank>

Figure 1:
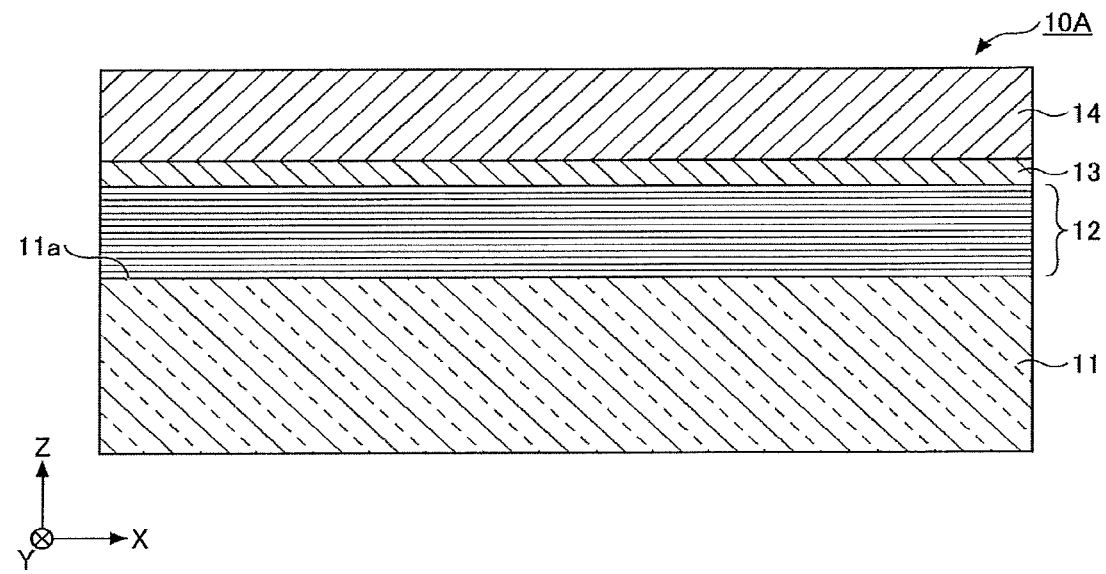
FIG. 1 is a schematic cross-sectional view of a reflective mask blank in the first embodiment.

Reflective mask blanks in the first embodiment are described. FIG. 1 is a schematic cross-sectional view of a reflective mask blank in the first embodiment. As shown in FIG. 1, the reflective mask blank 10A includes a substrate 11, a reflective layer 12, a protective layer 13, and an absorber layer 14. The reflective mask blank 10A has a lamination structure including a substrate 11, a reflective layer 12, a protective layer 13, and an absorber layer 14 in this order from the substrate 11 side.

(Substrate)

The substrate 11 preferably has a low coefficient of thermal expansion. The substrate 11 having a low coefficient of thermal expansion is more effective for inhibiting the pattern to be formed in the absorber layer 14 from being distorted by heat generated by exposure of EUV light. Specifically, the coefficient of thermal expansion at 20° C. of the substrate 11 is preferably $0 \pm 1.0 \times 10^{-7}/°$ C., more preferably $0 \pm 0.3 \times 10^{-7}/°$ C. As a material having a low coefficient of thermal expansion, for example, an $SiO_2$-$TiO_2$ glass or the like may be used. Preferred for use as the $SiO_2$-$TiO_2$ glass is a quartz glass including 90 to 95% by mass of $SiO_2$ and 5 to 10% by mass of $TiO_2$. In the case where the $TiO_2$ content is 5 to 10% by mass, the coefficient of thermal expansion at around room temperature is approximately zero, and the substrate shows substantially no dimensional change at around room temperature. The $SiO_2$-$TiO_2$ glass may contain minor ingredients besides $SiO_2$ and $TiO_2$.

It is preferable that the first main surface 11a of the substrate 11 which is on the side where the reflective layer 12 is to be laminated has high surface smoothness. The surface smoothness of the first main surface 11a can be evaluated in terms of surface roughness. The surface roughness of the first main surface 11a is preferably 0.15 nm or less in terms of root-mean-square roughness Rq. The surface smoothness can be determined with an atomic force microscope.

It is preferred to subject the first main surface 11a to surface processing so as to have a given flatness. This is for obtaining a reflective mask having a high pattern transfer accuracy and a high positional accuracy. In the substrate 11, the flatness is preferably 100 nm or less in a given region (e.g., a region of 132 mm×132 mm) of the first main surface 11a. The flatness thereof is more preferably 50 nm or less, even more preferably 30 nm or less.

It is also preferable that the substrate 11 has resistance to a cleaning liquid to be used, for example, for cleaning the reflective mask blank, the reflective mask blank after pattern formation or reflective mask.

It is further preferable that the substrate 11 has high rigidity from the standpoint of preventing the substrate 11 from deforming due to the stress of the films (e.g., the reflective layer 12) to be formed over the substrate 11. For example, the substrate 11 preferably has a Young' modulus of 65 GPa or more.

The size, thickness or the like of the substrate 11 are suitably determined depending on design values for the reflective mask or the like.

The first main surface 11a of the substrate 11 is made to have a rectangular or circular shape from planar view. In this specification, the term "rectangular shape" means any of shapes such as a rectangle or square shape and the shape of a rectangle or square in which the corners are rounded.

(Reflective Layer)

The reflective layer 12 has a high EUV light reflectance. Specifically, in the case where EUV light enters the surface of the reflective layer 12 at an incidence angle of 6°, the maximum value of the reflectance to EUV light having a wavelength of about 13.5 nm is preferably 60% or more, more preferably 65% or more. Also in the case where the protective layer 13 and the absorber layer 14 are laminated on/above the reflective layer 12, the maximum value of the reflectance to EUV light having a wavelength of about 13.5 nm is preferably 60% or more, more preferably 65% or more.

The reflective layer 12 is a multilayer film formed by periodically laminating each of layers including elements differing in refractive index as main components. Generally used as the reflective layer 12 is a multilayer reflective film formed by laminating high-refractive-index layers having a high refractive index to EUV light and low-refractive-index layers having a low refractive index to EUV light alternately with each other from the substrate 11 side.

The multilayer reflective film may be obtained by forming a multilayer structure in which a high-refractive-index layer and a low-refractive-index layer are laminated in this order from the substrate 11 side and which is taken as one unit, and repeatedly laminating this multilayer structure multiple times, or may be obtained by forming a multilayer structure in which a low-refractive-index layer and a high-refractive-index layer are laminated in this order from the substrate 11 side and which is taken as one unit, and repeatedly laminating this multilayer structure multiple times. In this case, the multilayer reflective layer preferably has a high-refractive-index layer as the outermost layer (uppermost layer). This is because low-refractive-index layers are prone to be easily oxidized and there is hence a possibility that the reflective layer 12 having a low-refractive-index layer as the uppermost layer may decrease in reflectance.

As the high-refractive-index layers, a layer including Si may be used. As a material including Si, examples thereof include Si simple substance or an Si compound including Si and one or more elements selected from the group consisting of B, C, N, and O. By using the high-refractive-index layer including Si, a reflective mask having an excellent EUV light reflectance can be obtained. As the low-refractiveindex layers, examples thereof include a metal selected from the group consisting of Mo, Ru, Rh, and Pt or an alloy of these metals. In this embodiment, it is preferable that the low-refractive-index layers are Mo layers and the high-refractive-index layers are Si layers. In this case, by disposing a high-refractive-index layer (Si layer) as the uppermost layer of the reflective layer 12, a silicon oxide layer including Si and O is formed between the outermost layer (Si layer) and the protective layer 13, thereby improving the cleaning resistance of the reflective mask.

Although the reflective layer 12 includes a plurality of high-refractive-index layers and a plurality of low-refractive-index layers, each of the high-refractive-index layers or low-refractive-index layers needs not have the same thickness.

The thickness of each of the layers in the reflective layer 12 and the number of units can be suitably selected depending on the materials for forming films, the EUV light reflectance required of the reflective layer 12, the wavelength of the EUV light (exposure wavelength) or the like. For example, in the case where the reflective layer 12 is designed to have a maximum reflectance of 60% or more to EUV light having a wavelength of about 13.5 nm, it is preferred to use an Mo/Si multilayer reflective film formed by alternately laminating a low-refractive-index layer (Mo layer) and a high-refractive-index layer (Si layer) 30 to 60 times.

The layers in the reflective layer 12 can each be deposited to have a desired thickness using a known deposition method such as magnetron sputtering or ion beam sputtering. For example, in the case of forming the reflective layer 12 using ion beam sputtering, ions are supplied from an ion source to a target of a high-refractive-index material and a target of a low-refractive-index material, thereby performing deposition. In the case where the reflective layer 12 is an Mo/Si multilayer reflective film, the following procedure is, for example, conducted using ion beam sputtering: first, an Si target is used to deposit an Si layer having a given thickness on a substrate 11; thereafter, an Mo target is used to deposit an Mo layer having a given thickness thereon; and the Si layer and the Mo layer in combination are taken as one unit and the deposition is repeated performed 30 to 60 units, thereby forming an Mo/Si multilayer reflective film.

(Protective Layer)

When the absorber layer 14 is etched (usually, dry-etched) to form an absorber pattern 141 in the absorber layer 14 (see FIG. 7) in the production of a reflective mask 20 which is described later (see FIG. 7), the protective layer 13 serves to protect the reflective layer 12 by inhibiting the surface of the reflective layer 12 from being damaged by the etching. Furthermore, when the reflective mask blank after the etching treatment is cleaned by removing the resist layer 18 remaining in the reflective mask blank (see FIG. 8) with a cleaning liquid, the protective layer 13 protects the reflective layer 12 from the cleaning liquid. Because of this, the reflective mask 20 obtained (see FIG. 7) has a satisfactory EUV light reflectance.

Although FIG. 1 shows a reflective mask blank in which the protective layer 13 is a single layer, the protective layer 13 may be a plurality of layers.

As a material for forming the protective layer 13, a substance which is less apt to be damaged by the etching of the absorber layer 14 is selected. Examples of substances which satisfy the requirement include: Ru-based materials such as Ru metal simple substance, Ru alloys including Ru and one or more metals selected from the group consisting of B, Si, Ti, Nb, Mo, Zr, Y, La, Co, and Re, and nitrides including these Ru alloys and nitrogen contained therein; Cr, Al, Ta, and nitrides including any of these metals and nitrogen; and $SiO_2$, $Si_3N_4$, $Al_2O_3$, and mixtures of two or more of these. Preferred examples thereof include Ru metal simple substance, Ru alloys, CrN, and $SiO_2$. Ru metal simple substance and Ru alloys are especially preferred because these materials are less apt to be etched with oxygen-free gases and are capable of functioning as an etching stopper during processing for producing a reflective mask.

In the case where the protective layer 13 is constituted of an Ru alloy, the Ru content in the Ru alloy is preferably 95 at % or more and less than 100 at %. In the case where the Ru content falls within that range and the reflective layer 12 is an Mo/Si multilayer reflective film, it is possible to inhibit Si from diffusing from the Si layers of the reflective layer 12 to the protective layer 13. This protective layer 13 can function as an etching stopper during etching of the absorber layer 14, while ensuring a sufficient EUV light reflectance. Furthermore, this protective layer 13 can give a reflective mask to have cleaning resistance and can prevent the reflective layer 12 from deteriorating with the lapse of time.

The thickness of the protective layer 13 is not particularly limited so long as the protective layer 13 can perform its functions. From the standpoint of maintaining the reflectance to EUV light reflected by the reflective layer 12, the thickness of the protective layer 13 is preferably 1 nm or more, more preferably 1.5 nm or more, even more preferably 2 nm or more. The thickness of the protective layer 13 is preferably 8 nm or less, more preferably 6 nm or less, even more preferably 5 nm or less.

For forming the protective layer 13, a known deposition method such as magnetron sputtering or ion beam sputtering can be used.

(Absorber Layer)

The absorber layer 14 is required to have desired properties necessary for use in a reflective mask for EUV lithography, such as a high absorption coefficient for EUV light, high resistance to cleaning liquids, and a property of being easily etched.

The absorber layer 14 absorbs EUV light and has an extremely low EUV light reflectance. Specifically, in the case where the surface of the absorber layer 14 is irradiated with EUV light, the maximum value of reflectance to EUV light having a wavelength of about 13.5 nm is preferably 10% or less, more preferably 5% or less, still more preferably 2% or less, and particularly preferably 1% or less. It is hence necessary for the absorber layer 14 to have a high absorption coefficient for EUV light.

In the production of a reflective mask 20 which is described later (see FIG. 7), the absorber layer 14 is exposed to the cleaning liquid when a resist pattern 181 (see FIG. 8) remaining in the reflective mask blank after etching is removed with a cleaning liquid.

As this cleaning liquid used, examples thereof include a sulfuric acid hydrogen peroxide mixture (SPM), sulfuric acid, ammonia, an ammonia hydrogen peroxide mixture (APM), OH radical cleaning water, ozonized water and the like. In EUV lithography, SPM is generally used as a cleaning liquid for resists. SPM is a solution obtained by mixing sulfuric acid and hydrogen peroxide, and sulfuric acid and hydrogen peroxide can be mixed in a volume ratio of, for example, 3:1. In this cleaning, it is preferred to control the temperature of the SPM to 100° C. or more, from the standpoint of improving the etching rate. The absorber layer 14 hence is required to have high resistance to the cleaning liquid. It is preferable that the absorber layer 14 has a low etching rate (e.g., 0.10 nm/min or less) when immersed in a 100° C. solution including 75 vol % of sulfuric acid and 25 vol % of hydrogen peroxide.

The absorber layer 14 is processed by etching, for example dry etching, with a gas based on chlorine (Cl) such as $Cl_2$, $SiCl_4$, or $CHCl_3$, or a gas based on fluorine (F) such as $CF_4$ or $CHF_3$. The absorber layer 14 hence is required to be easily etched.

In order to achieve the above properties, the absorber layer 14 contains Sn as a main component and Ta in an amount of 25 at % or more. The absorber layer 14 can be formed of an Sn—Ta alloy. The Sn—Ta alloy is in the state of containing one or more substances selected from the group consisting of Ta, Sn, $TaSn_2$, and $Ta_3Sn$, depending on the conditions used for depositing Sn and Ta and on the contents of Sn and Ta.

In this specification, the expression "containing Sn as a main component" means that Sn is contained in the material in the largest amount in terms of at % among all the metallic elements. In the case where the absorber layer 14 contains nonmetallic elements such as N and O besides metallic elements such as Sn and Ta, the term "main component" means a metallic element contained in the largest amount in terms of the content in at % calculated after the nonmetallic elements are excluded. Namely, the term "main component" means the main component among the metallic elements, which do not include the nonmetallic elements. The content of Sn (Sn content) is preferably 30 at % or more, more preferably 40 at % or more, even more preferably 50 at % or more, especially preferably 55 at % or more. The Sn content is preferably 75 at % or less, more preferably 70 at % or less, especially preferably 65 at % or less.

In the case where the Sn content is 30 at % or more, the absorber layer 14 has high light absorption even when the absorber layer 14 is thin, because Sn has a high absorption coefficient for EUV light. Consequently, the absorber layer 14 can be made to have a reduced thickness.

Figure 2:
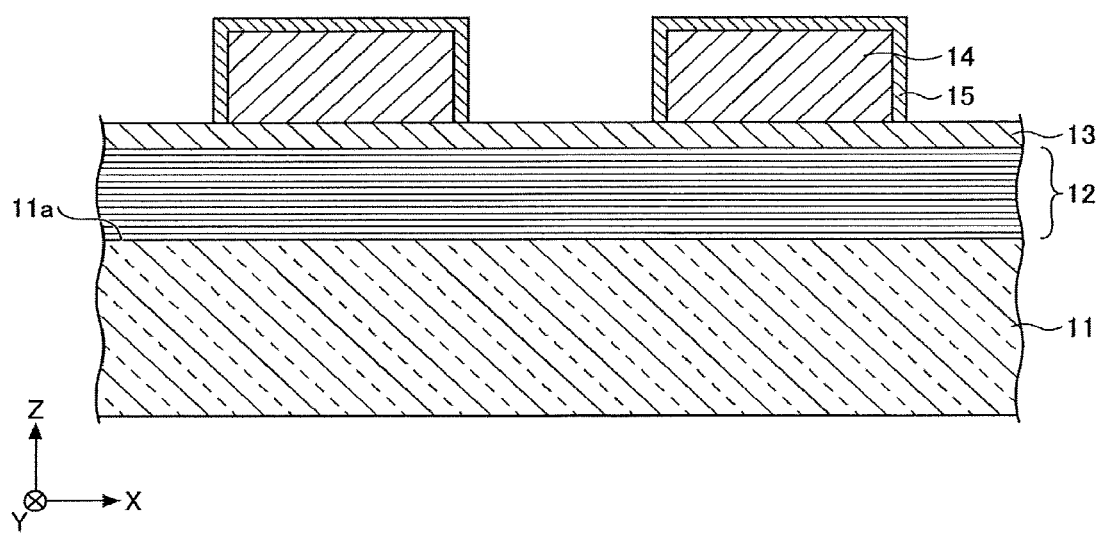
FIG. 2 is a diagram illustrating a state in which a passive film is formed on the surface of the absorber layer.

In the case where the Sn content is 75 at % or less, the content of Ta (Ta content) is 25 at % or more. In this case, in the production of the reflective mask 20 which is described later (see FIG. 7), when the reflective mask blank after etching is cleaned with SPM as a cleaning liquid, a surface oxide film (passive film) 15 made of tantalum oxide ($Ta_2O_5$) is formed in the surface of the absorber layer 14 as shown in FIG. 2. The absorber layer 14 is thus protected and is hence inhibited from being etched. Consequently, the absorber layer 14 has high cleaning resistance.

In the production of a reflective mask 20 (see FIG. 7), a resist layer 18 (see FIG. 8) formed on the reflective mask blank 10A (see FIG. 1) is subjected to drawing (exposure) with electron beam (EB exposure). After the EB exposure, the absorber layer 14 is dry-etched (see FIG. 8), and the resist layer 18 is removed (see FIG. 7). For the removal of the resist layer 18, ashing is used. However, cleaning with SPM is further necessary for completely removing the resist residue. In the case where the absorber layer 14 has an Sn content of 75 at % or less and a Ta content of 25 at % or more, the absorber layer 14 can be made to have higher resistance to cleaning liquids such as SPM. Thus, the absorber layer 14 can satisfy the cleaning resistance required of the reflective mask 20 (see FIG. 7).

In the case where the passive film 15 formed by the cleaning of the reflective mask blank after etching is too thick, there is a possibility that the absorber layer 14 may fluctuate in reflectance. In the case where the absorber layer 14 has the Sn content of 75 at % or less and the Ta content of 25 at % or more, a passive film 15 having a reduced thickness can be formed in the surface of the absorber layer 14. Thus, the absorber layer 14 can be inhibited from fluctuating in reflectance. The upper limit of the Ta content is not particularly limited. As described above, the absorber layer 14 contains Sn as a main component, and thus, the Ta content is smaller than the Sn content.

Figure 3:
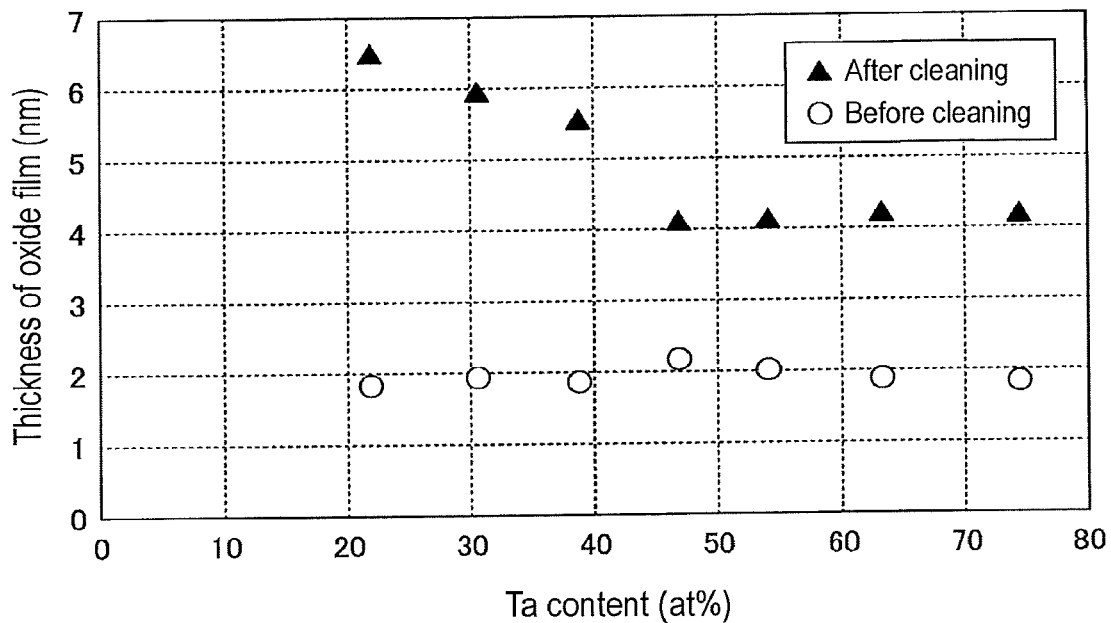
FIG. 3 is a graph showing relationships between Ta content and the thickness of the passive film formed on the surface of an absorber layer.

FIG. 3 shows examples of the relationships between the Ta content of the absorber layer and the thickness of the passive film 15 formed in the surface of the absorber layer 14. In the surface of the absorber layer 14 before cleaning with SPM, an oxide film having a thickness of about 2 nm is formed by natural oxidation. Through cleaning with SPM, the oxide film increases in thickness due to the oxidizing function by the SPM to protect the inside thereof. The oxide film formed by natural oxidation thus becomes a passive film 15. As shown in FIG. 3, in the case where the Ta content in the absorber layer is 25 at % or more, the passive film 15 can have a thickness reduced to 6 nm or less. The oxide film formed by natural oxidation is a film formed in the surface of the absorber layer when the absorber layer after sputtering is exposed to the air. This oxide film formed by natural oxidation has the composition of SnTaO. It is thought that the Sn dissolves away from the oxide film formed by natural oxidation thereafter during the cleaning with SPM and the composition changes into TaO, thereby giving the passive film 15.

In this specification, the term "thickness of the passive film 15" means the length along the direction perpendicular to the surface of the absorber layer 14. The thickness of the passive film 15 is determined, for example, by measuring the thickness of any portion of a cross-section of the passive film 15. When any several portions of a cross-section of the passive film 15 are examined for thickness, an average of the measured thickness values for these portions may be taken as the thickness of the passive film 15.

Meanwhile, since the absorber layer 14 includes Sn as a main component and Ta in an amount of 25 at % or more, the absorber layer 14 can be easily etched with a Cl-based gas because Sn is easily etched with Cl-based gases and Ta is easily etched with Cl-based gases, F-based gases or the like.

It is preferable that the absorber layer 14 has a rate of etching with SPM of 0.10 nm/min or less. The etching rate thereof is more preferably 0.09 nm/min or less, even more preferably 0.07 nm/min or less, especially preferably 0.05 nm/min or less. In the case where the rate of etching of the absorber layer 14 with SPM is 0.10 nm/min or less, an absorber pattern 141 (see FIG. 7) can be approximately evenly formed in accordance with the resist pattern disposed on the absorber layer 14 in the production of the reflective mask 20 (see FIG. 7). The rate of etching of the absorber layer 14 with SPM can be determined, for example, through immersion in SPM composed of 75 vol % of sulfuric acid and 25 vol % of hydrogen peroxide and heated at 100° C. The smaller rate of etching with SPM is more preferred, and the lower limit of the rate of etching with SPM is 0 nm/min.

The absorber layer 14 may contain one or more elements selected from the group consisting of N, O, B, Hf, Si, Zr, Ge, Pd, and H, besides Sn and Ta. It is preferable that N, O, or B is contained among these. In the case where at least one element of N or O is contained besides Sn and Ta, the absorber layer 14 can have improved resistance to oxidation and hence have improved long-term stability. In the case where B is contained besides Sn and Ta, the absorber layer 14 can be amorphous or have a finely crystalline structure in the crystalline state. It is preferable that the absorber layer 14 is amorphous in the crystalline state. The absorber layer 14 has excellent surface smoothness and flatness. The improvement in the surface smoothness and flatness of the absorber layer 14 reduces the edge roughness of the absorber pattern 141 (see FIG. 7), making it possible to heighten the dimensional accuracy of the absorber pattern 141 (see FIG. 7).

The absorber layer 14 may be a single-layer film or a multilayer film having a plurality of films. In the case where the absorber layer 14 is a single-layer film, the number of steps necessary for mask blank production can be reduced and the production efficiency can be heightened. In the case where the absorber layer 14 is a multilayer film, the absorber layer 14 can be made usable as an antireflection film when the absorber pattern 141 (see FIG. 7) is inspected using inspection light, by suitably setting the optical constants and thicknesses of the upper layer(s) in the absorber layer 14.

The thickness of the absorber layer 14 can be suitably set depending on the composition of the absorber layer 14 or the like. However, the smaller thicknesses are preferred from the standpoint of reducing the thickness of the reflective mask blank 10A The thickness of the absorber layer 14 is, for example, preferably 40 nm or less from the standpoints of keeping the reflectance of the absorber layer 14 being 10% or less and obtaining sufficient contrast. The thickness of the absorber layer 14 is more preferably 35 nm or less, even more preferably 30 nm or less, especially preferably 25 nm or less, most preferably 20 nm or less. The lower limit of the thickness of the absorber layer 14 is determined by reflectance, and the thinner of the absorber layer 14 is the better within the range where the reflectance to EUV light having a wavelength around 13.5 nm is 10% or less, and for example, the thickness of the absorber layer 14 is preferably 10 nm or more. Since the thinner of the absorber layer 14 is the better, as the lower limit thereof, the thickness of the absorber layer 14 is preferably 5 nm or more, more preferably 3 nm or more, and particularly preferably 1 nm or more. The thickness of the absorber layer 14 can be measured, for example, by X-ray reflectometry (XRR) or with a TEM or the like.

The absorber layer 14 can be formed using a known deposition method such as magnetron sputtering or ion beam sputtering. For example, in the case of forming an SnTa film as the absorber layer 14 by magnetron sputtering, the absorber layer 14 can be deposited by sputtering using an Ar gas and a target including Sn and Ta.

As described above, the reflective mask blank 10A includes an absorber layer 14 including Sn as a main component and Ta in an amount of 25 at % or more. Because of the inclusion of Sn and Ta in respective amounts within given ranges, the absorber layer 14 can have excellent cleaning resistance in the production of a reflective mask (see FIG. 7). In the reflective mask blank 10A, an absorber pattern 141 (see FIG. 7) can hence be stably formed in the absorber layer 14.

The reflective mask blank 10A can have a higher EUV light absorptivity even when the absorber layer 14 has a smaller thickness. Consequently, the absorber layer 14 can be made to have a reduced EUV light reflectance while attaining a reduction in the thickness of the reflective mask blank 10A.

Furthermore, the reflective mask blank 10A has excellent processability since the absorber layer 14 can be easily etched.

<Process for producing the Reflective Mask Blank>

Figure 4:
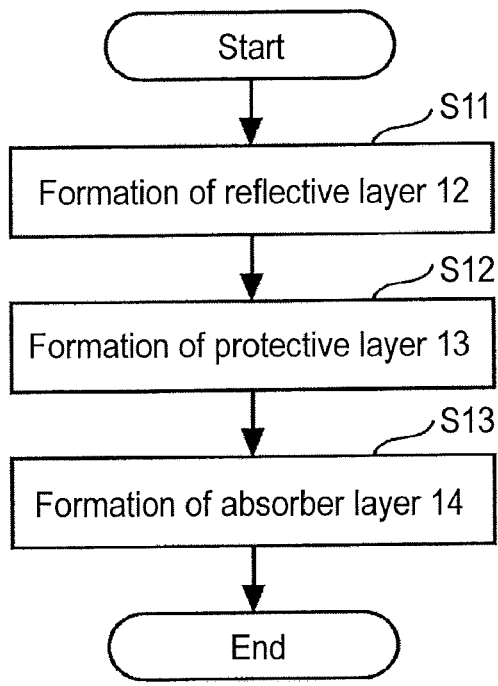
FIG. 4 is a flowchart showing an example of a process for producing a reflective mask blank.

The process for producing the reflective mask blank 10A shown in FIG. 1 is described next. FIG. 4 is a flowchart showing an example of a process for producing the reflective mask blank 10A. As shown in FIG. 4, a reflective layer 12 is formed on a substrate 11 (step of forming reflective layer 12: step S11). The reflective layer 12 is deposited to have a desired thickness on the substrate 11 using a known deposition method in the manner shown above.

Subsequently, a protective layer 13 is formed on the reflective layer 12 (step of forming protective layer 13: step S12). The protective layer 13 is deposited to have a desired thickness on the reflective layer 12 using a known deposition method.

Next, an absorber layer 14 is formed on the protective layer 13 (step of forming absorber layer 14: step S13). The absorber layer 14 is deposited to have a desired thickness on the protective layer 13 using a known deposition method.

Thus, the reflective mask blank 10A shown in FIG. 1 is obtained.

(Other Layers)

Figure 5:
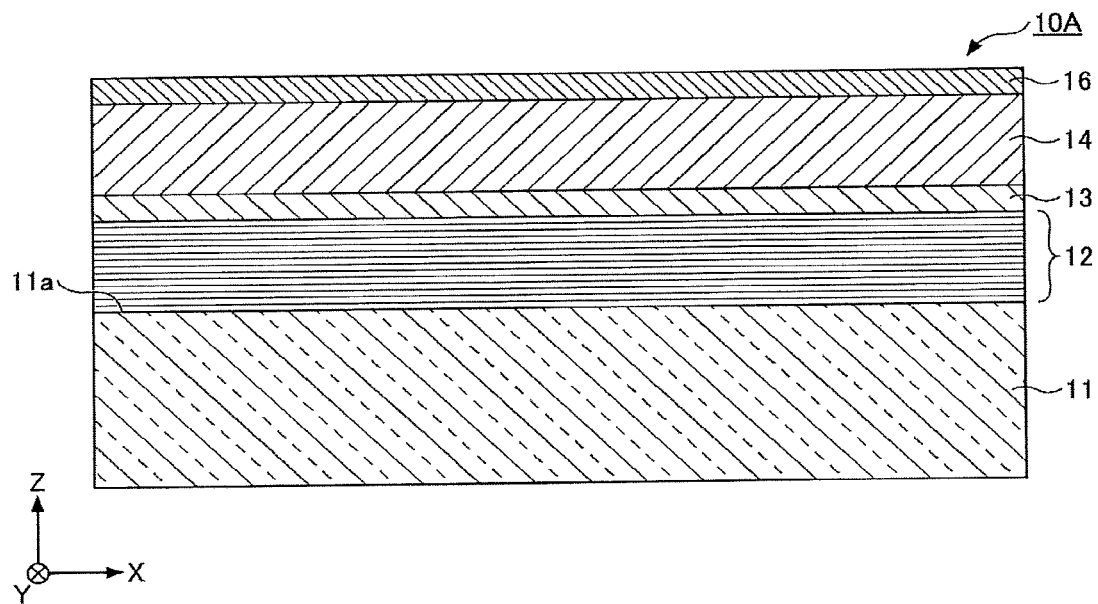
FIG. 5 is a schematic cross-sectional view of the reflective mask blank in another example.

The reflective mask blank 10A may include a hard mask layer 16 disposed on the absorber layer 14, as shown in FIG. 5. As the hard mask layer 16, use is made of a material having high resistance to etching, such as a Cr-based film or an Si-based film. Examples of the Cr-based film include Cr simple substance and materials including Cr and either O or N. Specific examples thereof include CrO, CrN and the like. Examples of the Si-based film include Si simple substance and materials including Si and one or more elements selected from the group consisting of O, N, C, and H. Specific examples thereof include $SiO_2$, SiON, SiN, SiO, Si, SiC, SiCO, SiCN, SiCON and the like. The Si-based film is preferred because the absorber layer 14 less apt to suffer side-wall recession when dry-etched.

The formation of the hard mask layer 16 on the absorber layer 14 makes it possible to perform dry etching to produce an absorber pattern 141 (see FIG. 7) having a reduced minimum line width. The hard mask layer 16 is hence effective for the line-width reduction in absorber patterns 141 (see FIG. 7). In the case where a layer(s) is laminated on/above the absorber layer 14, the hard mask layer 16 may be provided as the outermost layer above the absorber layer 14.

Figure 6:
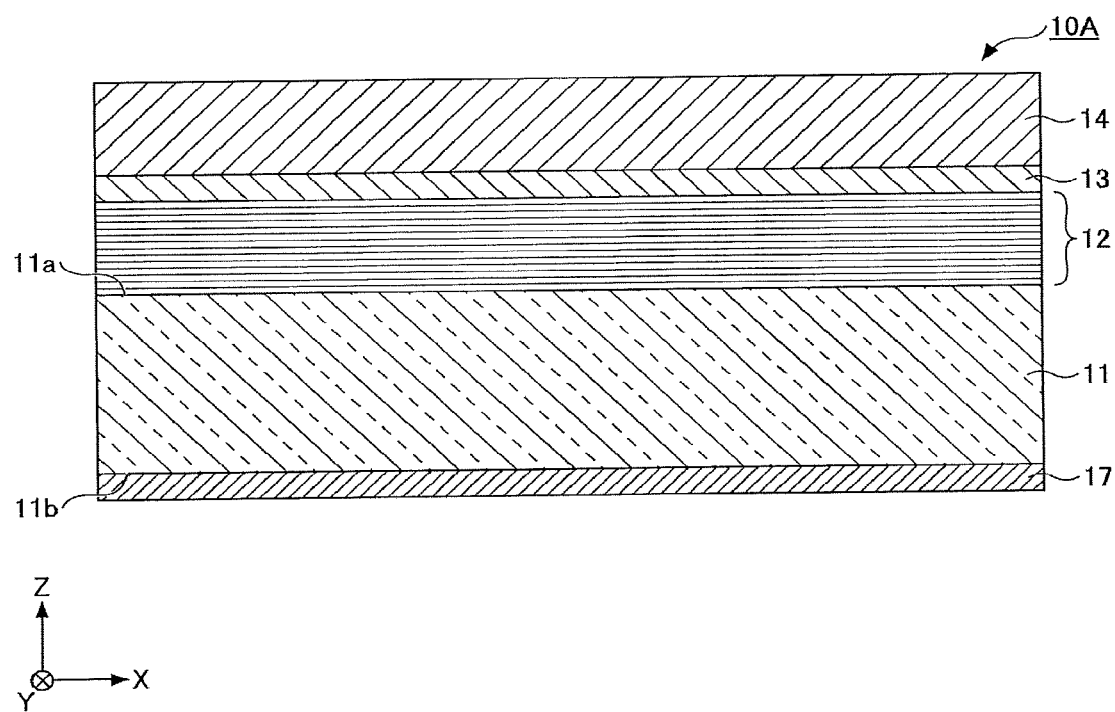
FIG. 6 is a schematic cross-sectional view of the reflective mask blank in still another example.

The reflective mask blank 10A may include a backside conductive layer 17 for electrostatic chucking disposed on the second main surface 11b of the substrate 11, which is on the side opposite to the side where the reflective layer 12 is laminated on the substrate 11, as shown in FIG. 6. The backside conductive layer 17 is required to have a low sheet resistance. The sheet resistance of the backside conductive layer 17 is, for example, 250Ω/square or less, preferably 200Ω/square or less.

As a material contained in the backside conductive layer 17, examples thereof include Cr or Ta or an alloy of either. As the Cr-containing alloy, use can be made of a Cr compound including Cr and one or more elements selected from the group consisting of B, N, O, and C. Examples of the Cr compound include CrN, CrON, CrCN, CrCON, CrBN, CrBON, CrBCN, CrBOCN and the like. As the Ta-containing alloy, use can be made of a Ta compound including Ta and one or more elements selected from the group consisting of B, N, O, and C. Examples of the Ta compound include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, TaSiCON and the like.

The thickness of the backside conductive layer 17 is not particularly limited so long as the function of electrostatic chucking is satisfied. For example, the thickness thereof is 10 to 400 nm. This backside conductive layer 17 can further serve to regulate stress on the second main surface 11b side of the reflective mask blank 10A. Namely, the backside conductive layer 17 can be regulated so that the stress resulting from various layers formed on the first main surface 11a side is balanced with the stress within the backside conductive layer 17 to keep the reflective mask blank 10A flat.

For forming the backside conductive layer 17, a known deposition method such as magnetron sputtering or ion beam sputtering can be used.

For example, the backside conductive layer 17 can be formed on the second main surface 11b of the substrate 11 before the formation of the protective layer 13.

<Reflective Mask>

Figure 7:
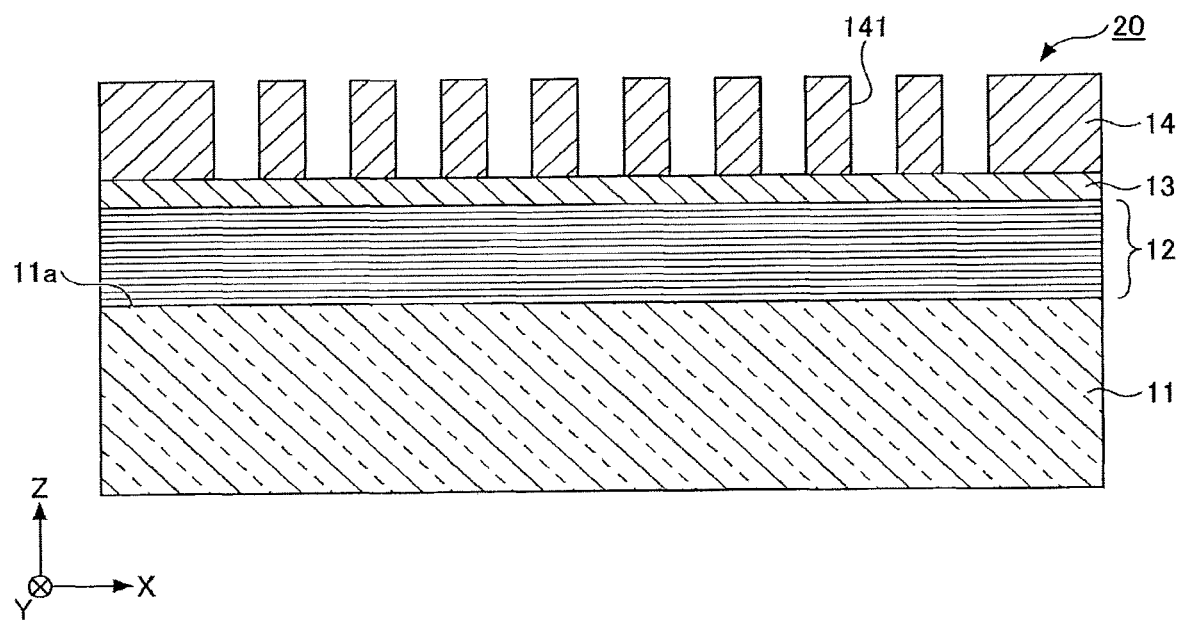
FIG. 7 is a schematic cross-sectional view of a reflective mask.

Next, a reflective mask obtained from the reflective mask blank 10A shown in FIG. 1 is described. FIG. 7 is a schematic cross-sectional view of a reflective mask in an example. As shown in FIG. 7, the reflective mask 20 is obtained by forming a desired absorber pattern 141 in the absorber layer 14 of the reflective mask blank 10A shown in FIG. 1.

Figure 8:
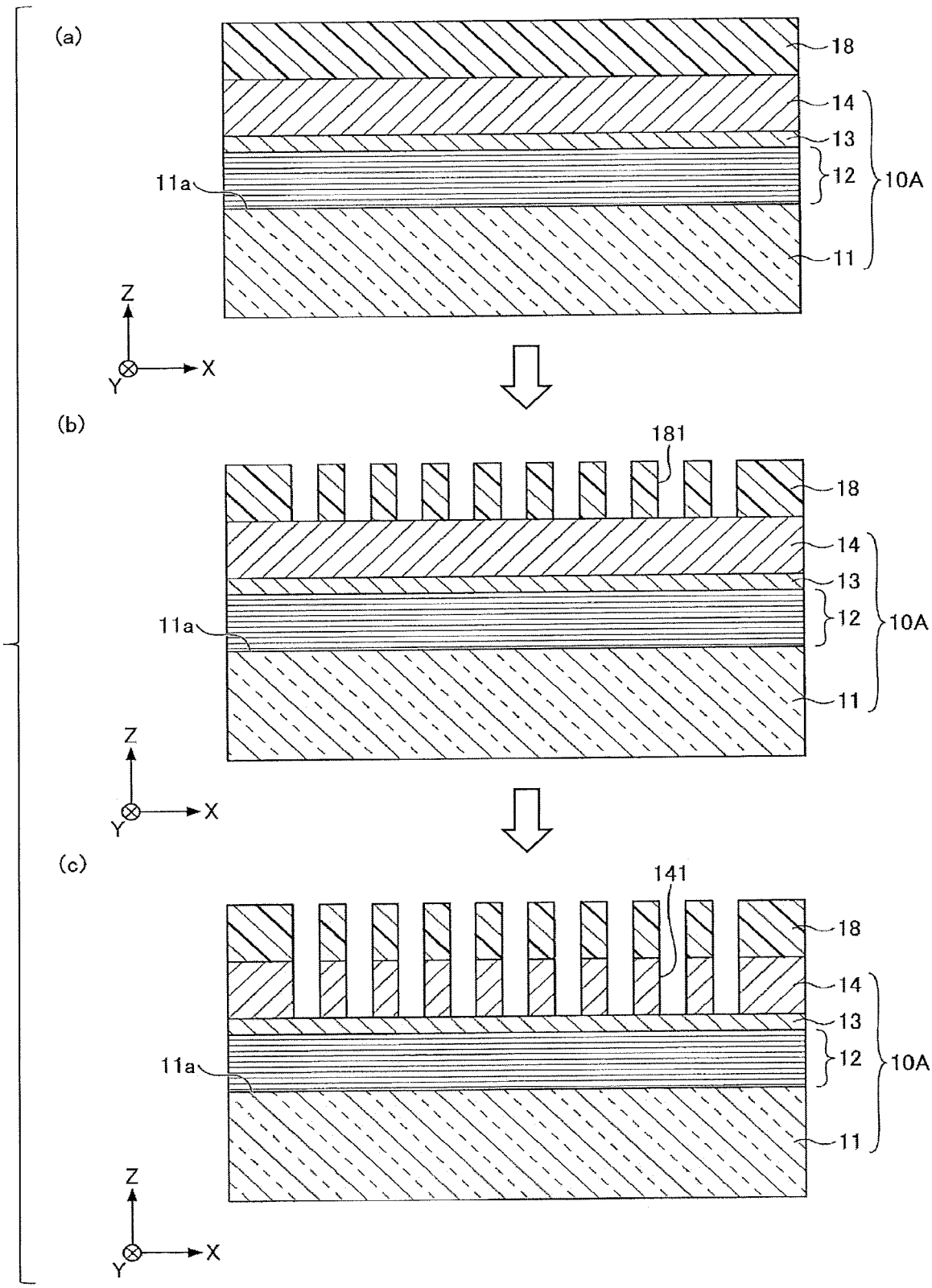
FIG. 8 is diagrams which illustrate steps for producing the reflective mask.

An example of the processes for producing the reflective mask 20 is described below. FIG. 8 is diagrams which illustrate steps for producing the reflective mask 20. As shown in (a) of FIG. 8, a resist layer 18 is formed on the absorber layer 14 of the reflective mask blank 10A shown in FIG. 1 described above.

Thereafter, the resist layer 18 is exposed in accordance with a desired pattern. After the exposure, the exposed portions of the resist layer 18 are developed, and this resist layer is rinsed with pure water. Thus, a given resist pattern 181 is formed in the resist layer 18 as shown in (b) of FIG. 8.

Subsequently, the resist layer 18 having the resist pattern 181 formed therein is used as a mask for dry-etching of the absorber layer 14. Thus, an absorber pattern 141 corresponding to the resist pattern 181 is formed in the absorber layer 14 as shown in (c) of FIG. 8.

As an etching gas, use can be made, for example, of an F-based gas, a Cl-based gas, or a mixed gas including a Cl-based gas and $O_2$, He, or Ar in a given proportion.

Thereafter, the resist layer 18 is removed with a resist remover liquid or the like, thereby forming a desired absorber pattern 141 in the absorber layer 14. Thus, a reflective mask 20 in which the desired absorber pattern 141 is formed in the absorber layer 14 can be obtained, as shown in FIG. 7.

The reflective mask 20 obtained is irradiated with EUV light by the illuminating optical system of an exposure device. The EUV light which enters the reflective mask 20 is reflected in the portions where the absorber layer 14 is not present (the absorber pattern 141 portions), and is absorbed in the portions where the absorber layer 14 is present. As a result, the EUV light reflected by the reflective layer 12 passes through a reductive-projection optical system of the exposure device and enters an exposure material (e.g., a wafer). Thus, the absorber pattern 141 of the absorber layer 14 is transferred to the surface of the exposure material, and a circuit pattern is formed in the surface of the exposure material.

Since the absorber layer 14 in the reflective mask 20 has high cleaning resistance, an absorber pattern 141 can be stably formed in the absorber layer 14. The reflective mask 20 hence has high pattern accuracy.

The absorber layer 14 in the reflective mask 20 can have a reduced thickness. Because of this, even in the case where the absorber pattern 141 of the absorber layer 14 has a small line width, the influence of shadowing can be reduced. The reflective mask 20 hence has an advantage in that the absorber pattern 141 of the absorber layer 14 can be faithfully transferred to the surface of an exposure material while attaining a reduction in layer thickness. Furthermore, since the absorber layer 14 can have a low EUV light reflectance, the reflective mask 20 has a high contrast even when the absorber layer 14 has a reduced thickness.

Second Embodiment

Figure 9:
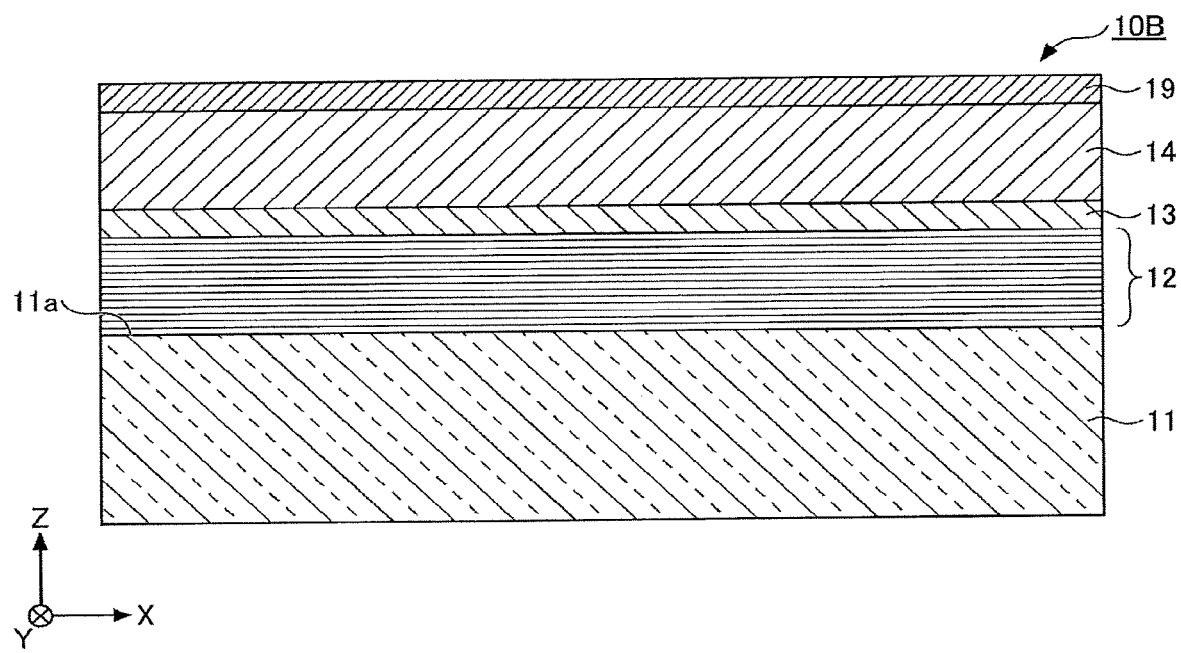
FIG. 9 is a schematic cross-sectional view of a reflective mask blank in the second embodiment.

A reflective mask blank in the second embodiment is described with reference to drawings. Any member having the same function as in the embodiment described above is designated by the same reference numeral and a detailed description thereof is omitted. FIG. 9 is a schematic cross-sectional view of a reflective mask blank in the second embodiment. As shown in FIG. 9, the reflective mask blank 10B includes a stabilizing layer 19 on the absorber layer 14 of the reflective mask blank 10A shown in FIG. 1. Namely, the reflective mask blank 10B has a lamination structure including a substrate 11, a reflective layer 12, a protective layer 13, an absorber layer 14, and a stabilizing layer 19 in this order from the substrate 11 side.

The stabilizing layer 19 can include one or more compounds selected from the group consisting of: oxides, nitrides, borides, oxynitrides, and oxyborides, each containing Ta and Sn; oxides of Ta, nitrides of Ta, borides of Ta, oxynitrides of Ta, and oxyborides of Ta; and Ru-based materials (Ru-based compounds) containing Ru.

In the case where the stabilizing layer 19 is one or more compounds selected from the group consisting of oxides, nitrides, borides, oxynitrides, and oxyborides, each containing Ta and Sn, examples of the oxides, nitrides, borides, oxynitrides, and oxyborides, each containing Ta and Sn include TaSnO, TaSnN, TaSnB, TaSnON, TaSnBO, TaSnBN, and TaSnBON.

In the case where the stabilizing layer 19 is an oxide or oxynitride film including Ta and Sn, which is selected from the oxides, nitrides, borides, oxynitrides, and oxyborides, each containing Ta and Sn, this stabilizing layer 19 can be formed from the same material as the absorber layer 14. Because of this, the target used for forming the absorber layer 14 can be used for forming the stabilizing layer 19. This stabilizing layer 19 can hence be easily formed on the main surface of the absorber layer 14, resulting in excellent production efficiency. Although this stabilizing layer 19 does not change in thickness even through cleaning, the stabilizing layer 19 may change in composition.

In the case where the stabilizing layer 19 is a film including Ta and Sn (Ta content: 50 at %) and the surface of the stabilizing layer 19 is examined by X-ray photoelectron spectroscopy (XPS) before and after cleaning with SPM, an example of Sn/Ta intensity ratios of the stabilizing layer 19 is shown in Table 1. Intensity ratios between components in the surface of the stabilizing layer 19 are reflected in XPS spectra obtained by XPS. The results given in Table 1 indicate the measurements of the Sn photoelectron spectrum intensity corresponding to $3d_{5/2}$ orbit, and the Ta photoelectron spectrum intensity corresponding to $4d_{5/2}$ orbit.

TABLE 1

| | Sn ($3d_{5/2}$ orbit)/Ta ($4d_{5/2}$ orbit) |
|---|---|
| Before cleaning with SPM | 1.42 |
| After cleaning with SPM | 0.14 |

Table 1 shows that the Sn content in the film surface considerably decreased due to the cleaning with SPM and the composition of the film surface changed accordingly.

This is because some of the Ta in the surface of the stabilizing layer 19 oxidizes to form a passive film 15 constituted of $Ta_2O_5$ (see FIG. 2) in the surface of the stabilizing layer 19 during the cleaning of the reflective mask blank after etching, as in the case where the passive film 15 constituted of $Ta_2O_5$ is formed in the surface of the absorber layer 14 (see FIG. 2). Consequently, in the stabilizing layer 19 which is an oxide or oxynitride film including Ta and Sn, a passive film 15 (see FIG. 2) may be formed in the surface of the stabilizing layer 19, resulting in a change in film composition.

In the case where the stabilizing layer 19 is one or more compounds selected from the group consisting of oxides of Ta, nitrides of Ta, borides of Ta, oxynitrides of Ta, and oxyborides of Ta, a film of any of oxides of Ta, nitrides of Ta, borides of Ta, oxynitrides of Ta, and oxyborides of Ta can be used as the stabilizing layer 19. Examples of the oxides of Ta, nitrides of Ta, borides of Ta, oxynitrides of Ta, and oxyborides of Ta include TaO, $Ta_2O_5$, TaN, $TaB_2$, TaON, TaCON, TaBN, TaBO, TaBON, TaBCON, TaHfO, TaHfN, TaHfON, TaHfCON, TaSiO, TaSiN, TaSiON, TaSiCON and the like. In the case where a film of an oxide of Ta or oxynitride of Ta is used as the stabilizing layer 19, this stabilizing layer 19 undergoes no change in composition through cleaning. Thus, the stabilizing layer 19 can be formed more stably.

A film including an Ru-based material (Ru-based film) can be used as the stabilizing layer 19. In the case where an Ru-based film is used as the stabilizing layer 19, the absorber layer 14 can be made thinner while maintaining a reflectance of 10% or less (particularly preferably 1% or less).

The thickness of the stabilizing layer 19 is preferably 10 nm or less. The thickness of the stabilizing layer 19 is more preferably 7 nm or less, even more preferably 6 nm or less, especially preferably 5 nm or less, most preferably 4 nm or less. The thickness of the stabilizing layer 19 is more preferably 1 nm or more, even more preferably 2 nm or more, especially preferably 3 nm or more.

The stabilizing layer 19 can be formed using a known deposition method such as magnetron sputtering, ion beam sputtering, or reactive sputtering. Reactive sputtering is, for example, a technique in which Ta, Sn, or SnTa is used as a target and a mixed gas obtained by mixing an inert gas, e.g., Ar or Kr, with oxygen or nitrogen is used as a sputtering gas.

Figure 10:
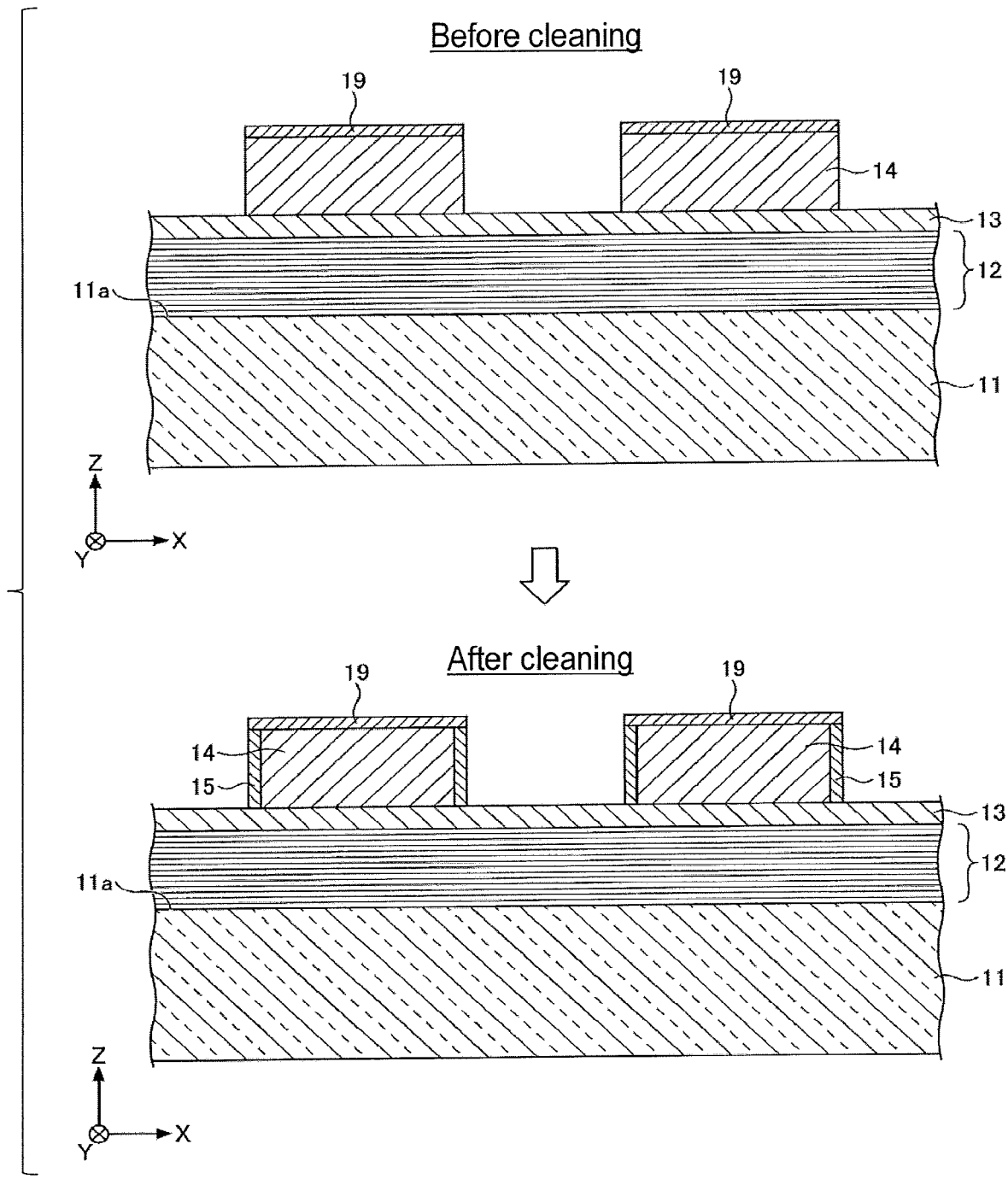
FIG. 10 is diagrams for illustrating the states of a reflective mask blank before and after cleaning.

Since the reflective mask blank 10B includes the stabilizing layer 19 on the absorber layer 14, the absorber layer 14 can have further enhanced cleaning resistance. The inclusion of the stabilizing layer 19 makes it possible to form strong and stable films with satisfactory reproducibility and to stabilize the properties of the reflective mask blank and reflective mask. After dry etching, the absorber layer 14 has exposed sidewalls as shown in FIG. 10. Through cleaning, however, a passive film 15 is formed in the sidewalls of the absorber layer 14. The absorber layer 14 can hence be inhibited from being etched by the cleaning and is protected.

Third Embodiment

Figure 11:
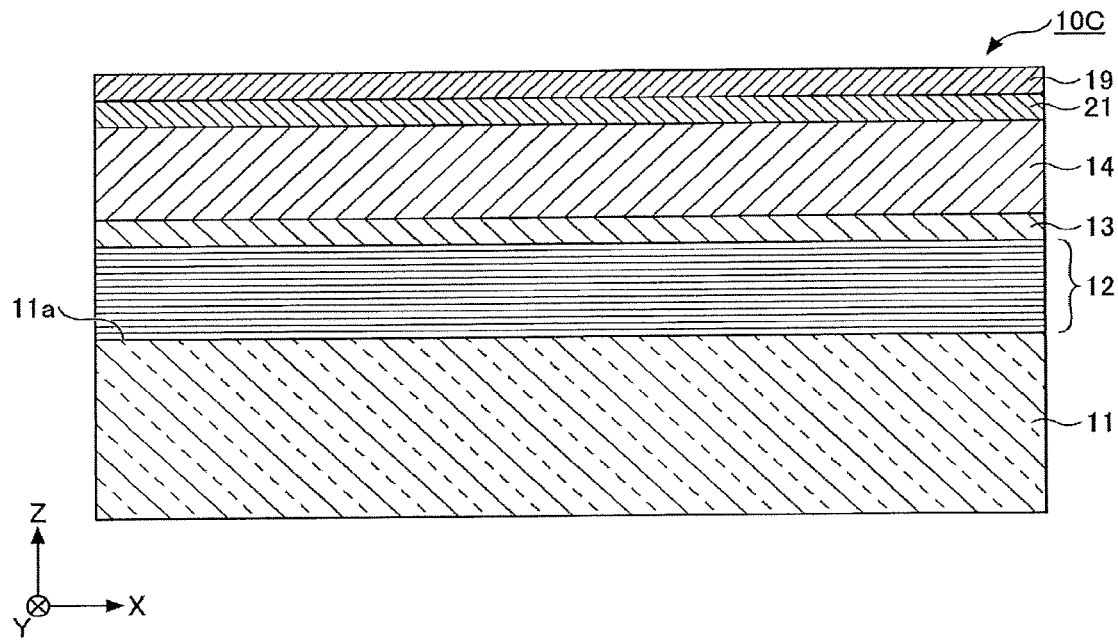
FIG. 11 is a schematic cross-sectional view of a reflective mask blank in the third embodiment.

A reflective mask blank in the third embodiment is described with reference to drawings. Any member having the same function as in either of the embodiments described above is designated by the same reference numeral and a detailed description thereof is omitted. FIG. 11 is a schematic cross-sectional view of a reflective mask blank in the third embodiment. As shown in FIG. 11, the reflective mask blank 10C includes a preventive layer 21 on the absorber layer 14, the preventive layer 21 being provided between the absorber layer 14 and stabilizing layer 19 in the reflective mask blank 10B shown in FIG. 9. Namely, the reflective mask blank 10C has a lamination structure including a substrate 11, a reflective layer 12, a protective layer 13, an absorber layer 14, a preventive layer 21, and a stabilizing layer 19 in this order from the substrate 11 side.

As a material which forms the preventive layer 21, Ta, Cr, or Si can be used. Only one of these elements may be included in the preventive layer 21, or two or more thereof may be included.

As the preventive layer 21, examples thereof include Ta simple substance, Cr simple substance, Si simple substance, a nitride of Ta, a nitride of Cr, a nitride of Si, a boride of Ta, a boride of Cr, a boride of Si, and a boronitride of Ta. One of these substances may be included alone, or two or more thereof may be included.

As the preferred composition of the preventive layer 21, examples thereof include Ta, TaN, TaB, and TaBN. For example, in the case where the stabilizing layer 19 includes an oxide of Ta, oxynitride of Ta, or oxyboride of Ta and the preventive layer 21 includes such material, then the same target can be used in the deposition of the preventive layer 21 and the stabilizing layer 19. This configuration hence has advantages, for example, in that the number of necessary deposition chambers can be reduced, and this reflective mask blank 10C can be produced highly efficiently.

The preventive layer 21 may further contain an element such as He, Ne, Ar, Kr, or Xe.

The preventive layer 21 is a layer containing no oxygen. The expression "containing no oxygen" means that the sputtering gas contains no oxygen and immediately after deposition of the preventive layer 21, oxygen is present in neither the surface nor the inside of the preventive layer 21. In the case where reactive sputtering involving oxygen is used for depositing the stabilizing layer 19, a component included in the preventive layer 21 may react with oxygen (oxidize) in the surface thereof which is in contact with the oxygen, thereby forming a film of an oxide in the surface of the preventive layer 21. In the case where the surface of the preventive layer 21 is in contact with oxygen in the step succeeding the deposition of the preventive layer 21 and comes to include an oxide film containing oxygen, the term "oxygen" in the expression "containing no oxygen" is not intended to include the oxygen in the oxide film. Meanwhile, the interface between the absorber layer 14 and the preventive layer 21 is not in contact with oxygen, and thus, oxygen is present neither at the interface between the preventive layer 21 and the absorber layer 14 nor in the vicinity of the interface. The term "vicinity" means a range of from the interface to a distance of less than 0.5 nm therefrom along the depth direction of the preventive layer 21.

The preventive layer 21 can be formed using a known deposition method such as magnetron sputtering or ion beam sputtering. For example, in the case of forming a Ta film, TaB film, or Si film as the preventive layer 21 using magnetron sputtering, this preventive layer 21 is deposited using a target including Ta, TaB, or Si and using an inert gas such as He, Ar, or Kr as a sputtering gas.

The thickness of the preventive layer 21 may be about several nanometers and is preferably 10 nm or less, from the standpoint of enabling the reflective mask blank 10C to give a pattern having a reduced thickness. The thickness of the preventive layer 21 is more preferably 8 nm or less, even more preferably 6 nm or less, especially preferably 5 nm or less, most preferably 4 nm or less. The thickness of the preventive layer 21 is more preferably 0.5 nm or more, even more preferably 1 nm or more, especially preferably 1.5 nm or more, most preferably 2 nm or more. The thickness of the preventive layer 21 can be measured, for example, by XRR or using a TEM.

In the case where the absorber layer 14 is in contact with oxygen, there is a possibility that a part of the Sn present in the surface of the absorber layer 14 may react with the oxygen to form an Sn-containing precipitate, e.g., fine particles, on the surface of the absorber layer 14. For example, in the case where a stabilizing layer 19 is formed by reactive sputtering, a mixed gas obtained by mixing an inert gas such as He, Ar, or Kr with oxygen is used as a sputtering gas as described above. In the case where the surface of the absorber layer 14 is in contact with such a mixed gas used as a sputtering gas, there is a possibility that a precipitate is formed on the surface of the absorber layer 14.

As described above, the preventive layer 21 is deposited on the absorber layer 14 using only an inert gas, such as He, Ar, or Kr, as the sputtering gas. Consequently, in the case where the preventive layer 21 is formed while keeping the absorber layer 14 not in contact with gases such as oxygen, the absorber layer 14 can be thus prevented from contacting with oxygen and the formation of a precipitate on the surface of the absorber layer 14 can hence be prevented.

Since the reflective mask blank 10C includes the preventive layer 21 on the absorber layer 14, the absorber layer 14 can be prevented from suffering precipitate formation on the surface thereof, and thus, the reflective mask can be inhibited from having defects in the production of the reflective mask. Thus, films having no defects can be stably formed.

In the reflective mask blank 10C, the preventive layer 21 can contain at least one element of Ta, Cr, or Si. These elements can be easily dry-etched and give excellent cleaning resistance. Because of this, in the case where the preventive layer 21 is configured so as to include, for example, Ta, the surface of the absorber layer 14 can be prevented from oxidizing even when the absorber layer 14 contains Sn. An absorber pattern 141 (see FIG. 7) having high cleaning resistance can hence be formed.

In the reflective mask blank 10C, the preventive layer 21 can be formed using Ta simple substance, Cr simple substance, Si simple substance, a nitride of Ta, a nitride of Cr, a nitride of Si, a boride of Ta, a boride of Cr, a boride of Si, or a boronitride of Ta. These simple substances, nitrides, borides, and boronitride are amorphous, and thus, the absorber pattern 141 (see FIG. 7) can be reduced in edge roughness. Consequently, in the case where the preventive layer 21 is configured so as to include, for example, a nitride of Ta, the surface of the Sn-containing absorber layer 14 can be prevented from oxidizing and an absorber pattern 141 (see FIG. 7) having high accuracy can be formed.

In the reflective mask blank 10C, the preventive layer 21 can be formed so as to contain at least one element of He, Ne, Ar, Kr, or Xe. There are cases where use of one or more of these elements as a sputtering gas in the deposition of the preventive layer 21 results in inclusion of a slight amount of the elements in the preventive layer 21. In such cases, however, the inclusion of the elements does not affect the properties of the preventive layer 21 and the preventive layer 21 can perform its function.

In the reflective mask blank 10C, the preventive layer 21 can have a thickness of 10 nm or less. The preventive layer 21 can hence be inhibited from being too thick. Consequently, this reflective mask blank 10C has an advantage in that the total thickness of the absorber pattern 141 (see FIG. 7) and the pattern formed thereon in both the preventive layer 21 and the stabilizing layer 19 can be reduced.

EXAMPLES

<Case 1>

Case 1-1 is a working example according to the present invention and Case 1-2 is a comparative example.

[Case 1-1]

(Production of Reflective Mask Blank)

An $SiO_2$-$TiO_2$ glass substrate (outer shape: about 152-mm square; thickness: about 6.3 mm) was used as a substrate for deposition. The glass substrate had a coefficient of thermal expansion of $0.02 \times 10^{-7}$/° C. The glass substrate was polished to impart thereto smooth surfaces having a surface roughness of 0.15 nm or less in terms of root-mean-square roughness Rq and a flatness of 100 nm or less. A Cr layer having a thickness of about 100 nm was deposited on the back surface of the glass substrate by magnetron sputtering, thereby forming a backside conductive layer (conductive film) for electrostatic chucking. This Cr layer had a sheet resistance of about 100Ω/square. The glass substrate was fixed using the Cr film. Thereafter, Si films and Mo films were alternately deposited on/above the front surface of the glass substrate using ion beam sputtering, by repeating the deposition of one Si film and one Mo film forty times. Each Si film had a thickness of about 4.5 nm, and each Mo film had a thickness of about 2.3 nm. Thus, a reflective layer (multilayer reflective film) having an overall thickness of about 272 nm [{(4.5 nm for each Si film)+(2.3 nm for each Mo film)}×40]. Thereafter, an Ru layer (thickness: about 2.5 nm) was deposited on the reflective layer using ion beam sputtering, thereby forming a protective layer (protective film). Subsequently, an absorber layer (absorber film) constituted of an Sn—Ta alloy was deposited on the protective layer by magnetron sputtering. Ar gas was used as a sputtering gas. A target composed of 60 at % Sn and 40 at % Ta was used in the sputtering, but the absorber layer formed by the sputtering had a Ta content of 48 at %. The Sn content and Ta content in the absorber layer were determined by X-ray fluorescence analysis (XRF) (Delta, manufactured by Olympus Co., Ltd.). The rotation of the stage was stopped during the sputtering for the formation of the absorber layer, thereby obtaining the absorber layer having a wide in-plane thickness distribution of 30 to 53 nm. Thus, the reflective mask blank 10A shown in FIG. 6 was produced. The thickness of the absorber layer was measured by XRR using an X-ray diffractometer (SmartLab HTP, manufactured by Rigaku Corp.). It was found through the examination by X-ray diffractometry (XRD) with the apparatus that the absorber layer constituted of an Sn—Ta alloy and was amorphous.

(Relationship Between Thickness and Reflectance of Absorber Layer)

Figure 12:
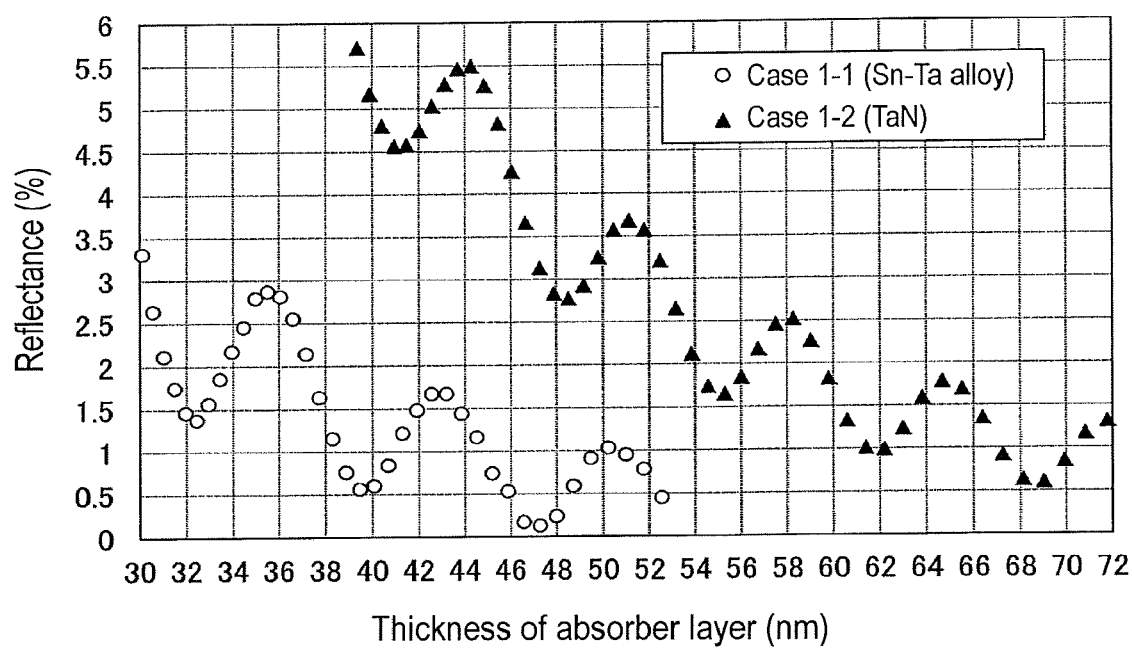
FIG. 12 is a graph showing relationships between the thickness of an absorber layer and reflectance.

The relationship between the thickness and reflectance of the absorber layer on the reflective mask blank was examined. A reflectance measurement was made using an EUV reflectometer (MBR, manufactured by AIXUV GmbH) for mask blanks. The EUV light had a wavelength of 13.5 nm. The relationship between the thickness and reflectance of the absorber layer is shown in FIG. 12. In order for a reflective mask to attain a sufficient contrast, the absorber layer preferably has a reflectance of 1% or less.

[Case 1-2]

The same procedure as in Case 1-1 was conducted, except that an absorber layer was formed using TaN in place of the Sn—Ta alloy. A relationship between the thickness and reflectance of the absorber layer is shown in FIG. 12.

As shown in FIG. 12, the reflectance in Case 1-1 was lower than that in Case 1-2. This is thought to be because Sn has a larger extinction coefficient than Ta. In Case 1-2, the minimum value to which the thickness of the absorber layer was able to be reduced while maintaining a reflectance of an absorber layer of 1% or less was about 62 nm. In contrast, in Case 1-1, the thickness of the absorber layer was able to be reduced to about 40 nm.

Consequently, in the case where an absorber layer is formed by an alloy including 52 at % Sn and 48 at % Ta, even when this absorber layer has a thickness of 40 nm, the absorber layer can have an EUV light reflectance of 1% or less and hence attain a sufficient contrast. The thickness of this absorber layer was thus found to be reduced to 40 nm or less.

<Case 2>

Cases 2-1 to 2-5 are working examples according to the present invention and Case 2-6 is a reference example.

[Case 2-1]

(Refractive Index and Extinction Coefficient of Absorber Layer)

The reflectance of an absorber layer constituted of an Sn—Ta alloy was determined by a simulation. In the simulation, the Sn content and Ta content of the absorber layer were taken as 30 at % and 70 at %, respectively. The simulation requires the refractive index (n) and extinction coefficient (k) of the absorber layer. As the refractive indexes and extinction coefficients of Sn and Ta, use was made of values from the database of Center for X-Ray Optics, Lawrence Berkeley National Laboratory. At a wavelength of 13.5 nm, Sn has a refractive index n of 0.9416 and an extinction coefficient k of 0.0725, and Ta has a refractive index n of 0.9429 and an extinction coefficient of 0.0408. The refractive index and extinction coefficient of the Sn—Ta alloy can be calculated using the density of the alloy. The density of the alloy was calculated by interpolation between the density of Sn (7.365 g/cm$^3$) and the density of Ta (16.69 g/cm$^3$) on the basis of the compositional proportion.

(Relationship between Thickness and Reflectance of Absorber Layer)

Figure 13:
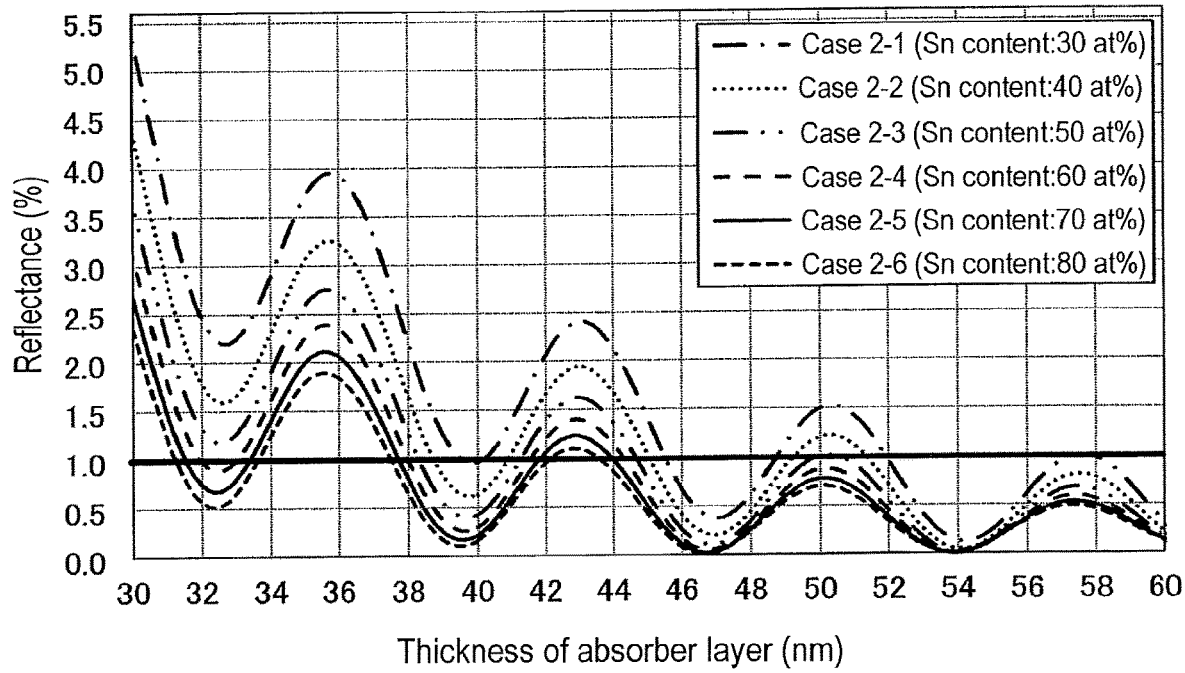
FIG. 13 is a graph showing the simulation results of relationships between the thickness of an absorber layer and reflectance.

A simulation was conducted on the assumption that the absorber layer had a thickness of 30 to 60 nm and EUV light was allowed to enter the reflective mask blank 10A at an incidence angle of 6° with respect to the reflective mask blank 10A. The wavelength of the EUV light was taken as 13.5 nm. The results of the simulation concerning the relationship between the thickness and reflectance of the absorber layer are shown in FIG. 13. As in Case 1-1, in order for a reflective mask blank to attain a sufficient contrast, the absorber layer preferably has a reflectance of 1% or less.

[Cases 2-2 to 2-6]

Simulations were conducted in the same manner as in Case 2-1, except that the Sn content in the absorber layer was changed to 40 at % (Case 2-2), 50 at % (Case 2-3), 60 at % (Case 2-4), 70 at % (Case 2-5), or 80 at % (Case 2-6). The results of the simulations concerning the relationship between the thickness and reflectance of the absorber layer of a reflective mask blank are shown in FIG. 13.

As shown in FIG. 13, in Cases 2-1 to 2-6, the EUV light reflectance was 1.0% or less when the thickness of the absorber layer was about 40 nm. In Cases 2-4 to 2-6, the EUV light reflectance was 1.0% or less even when the thickness of the absorber layer was about 32 nm. Consequently, so long as the Sn content in the absorber layer is 30 to 80 at %, this absorber layer can retain a reflectance of 1% or less and hence attain a sufficient contrast even when the thickness of the absorber layer is reduced to about 40 nm. Furthermore, so long as the Sn content in the absorber layer is 60 to 80 at %, this absorber layer can retain a reflectance of 1% or less even when the thickness of the absorber layer is further reduced to about 32 nm. In Case 2-6, however, the absorber layer showed a large film loss (see FIG. 15) upon cleaning with SPM as is described later, because the Sn content in the absorber layer was 80 at %.

It was thus found that so long as the absorber layer has an Sn content of 30 at % or more, this absorber layer can have a reflectance of 1% or less even when the thickness of the absorber layer is reduced to 40 nm.

<Case 3>

Cases 3-1 and 3-2 are working examples according to the present invention.

[Case 3-1]

Figure 14:
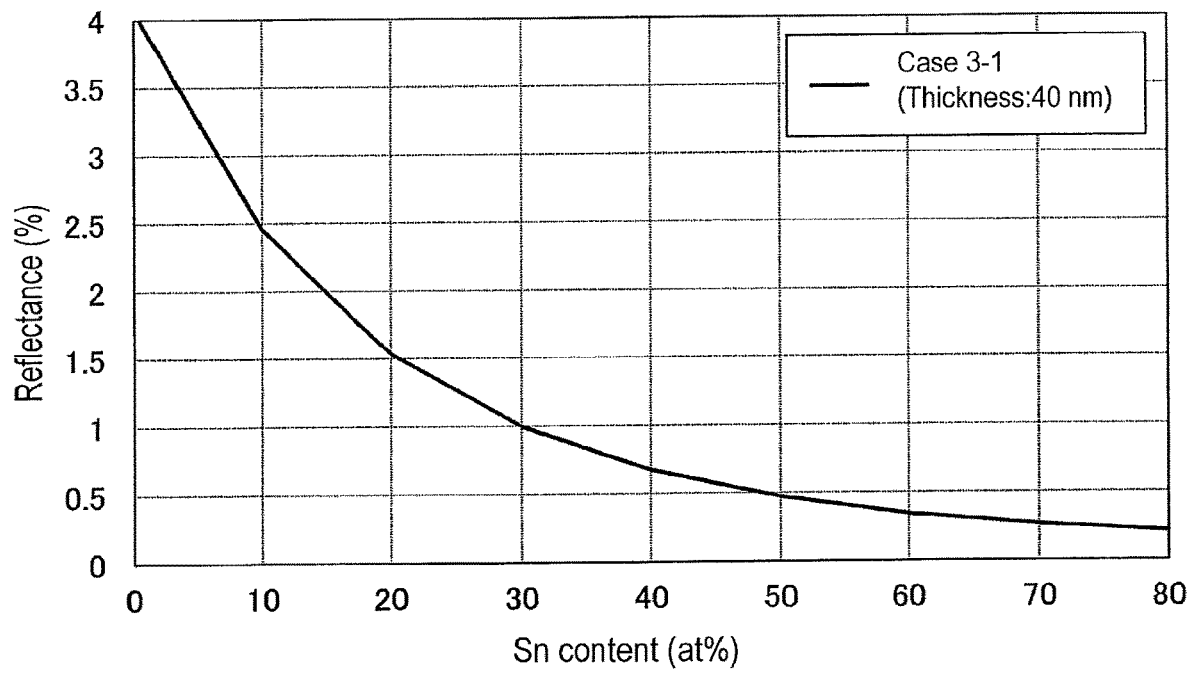
FIG. 14 is a graph showing a relationship between an Sn content and reflectance.

A simulation concerning EUV light reflectance was conducted in the same manner as in Case 2-1, except that the thickness of the absorber layer was fixed at 40 nm and the Sn content was changed. The results of the simulation concerning the relationship between the Sn content and reflectance are shown in FIG. 14.

[Case 3-2]

The same procedure as in Case 3-1 was conducted, except that the thickness of the absorber layer was fixed at 33 nm. In the case where the Sn content was 60 at %, the EUV light reflectance was about 1.0%. In the case where the Sn content was 70 at %, the EUV light reflectance was about 0.8%. In the case where the Sn content was 80 at %, the EUV light reflectance was about 0.6%.

(Relationship between Sn Content and Reflectance)

As shown in FIG. 14, it can be said that, in Case 3-1, the Sn content of 30 at % or more is sufficient for the absorber layer to have a reflectance of 1% or less. It was thus found that in the case where the absorber layer has a thickness of 40 nm, an EUV light reflectance of 1% or less can be attained so long as the Sn content is 30 at % or more. In Case 3-2, it was found that in the case where the absorber layer has a smaller thickness, for example, 33 nm, an EUV light reflectance of 1% or less can be attained so long as the Sn content is 60 at % or more (see Cases 2-4, 2-5, and 2-6 in FIG. 13).

Consequently, in the case where the absorber layer has a thickness of 40 nm, an EUV light reflectance of 1% or less can be attained by regulating the Sn content to 30 at % or more. By increasing the Sn content to 60 at % or more, the thickness of the absorber layer can be reduced to 33 nm.

<Case 4>

Cases 4-1 to 4-4 are working examples according to the present invention, Case 4-5 is a comparative example, and Case 4-6 is a reference example.

[Case 4-1]

(Formation of Absorber Layer)

An Si substrate was used as a substrate for deposition. An absorber film constituted of an Sn—Ta alloy was deposited on a surface of the Si substrate by magnetron sputtering. Ar gas was used as a sputtering gas. Dual-target sputtering employing a Ta target and an Sn target was conducted to deposit an absorber layer having a thickness of 40 nm so that the absorber layer had a Ta content of about 30 at % and an Sn content of about 70 at %.

(Relationship between Ta Content and Film Loss of Absorber Layer)

Figure 15:
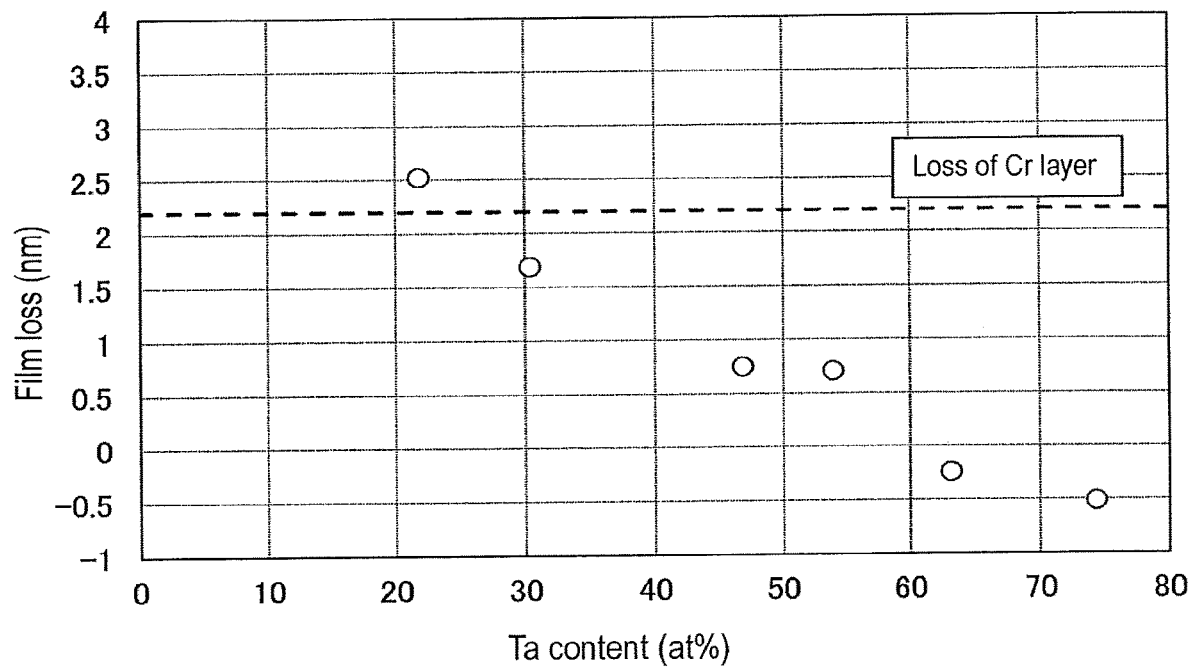
FIG. 15 is a graph showing a relationship between a Ta content of an SnTa film and the film loss thereof.

Thereafter, SPM (75 vol % of sulfuric acid and 25 vol % of hydrogen peroxide) was used as a cleaning liquid, and the Si substrate on which the absorber layer had been deposited was immersed for about 20 minutes in the SPM heated to 100° C. The Si substrate was taken out of the SPM, and the thickness of the absorber layer deposited on the Si substrate was then measured to determine the decrease in film thickness (film loss). The relationship between the Ta content and the film loss of the absorber layer is shown in Table 2 and FIG. 15. Absorber layers are required to have a film loss not larger than the film loss of Cr films which have conventionally been used as absorber layers. The film loss of the Cr films was taken as 2.2 nm. In FIG. 15, the film loss of the Cr films is indicated by the broken line.

[Cases 4-2 to 4-6]

The same procedure as in Case 4-1 was conducted, except that the Ta content and Sn content in the absorber layer were changed to the respective values shown in Table 2. The relationship between the Ta content and the film loss of the absorber layer is shown in Table 2 and FIG. 15.

TABLE 2

| | Absorber layer | | | |
|---|---|---|---|---|
| | Ta content (at %) | Sn content (at %) | Thickness (nm) | Film loss (nm) |
| Case 4-1 | 30 | 70 | 40 | 1.70 |
| Case 4-2 | 47 | 53 | 40 | 0.75 |
| Case 4-3 | 54 | 46 | 40 | 0.70 |
| Case 4-4 | 63 | 37 | 40 | −0.24 |
| Case 4-5 | 22 | 78 | 40 | 2.50 |
| Case 4-6 | 74 | 26 | 40 | −0.50 |

As shown in FIG. 15, the film losses in Cases 4-1 to 4-3 were smaller than the Cr films. Meanwhile, Case 4-5 showed a larger film loss than the Cr films. In Cases 4-4 and 4-6, the absorber layers increased in thickness. This is thought to be because during the immersion in the cleaning liquid, a passive film was formed in the surface of each absorber layer and grew. The absorber layer in Case 4-6 had cleaning resistance but had an increased reflectance because of the low Sn content.

FIG. 15 shows that so long as the Ta content in the absorber layer is 25 at % or more, cleaning resistance not lower than that of the Cr films conventionally used as absorber layers can be obtained. It was thus found that an absorber pattern can be stably formed in such absorber layer.

<Case 5>

Case 5-1 is a working example according to the present invention and Case 5-2 is a comparative example.

[Case 5-1]

(Formation of Absorber Layer)

The same absorber layer as in Case 4-1 was deposited on an Si substrate.

(Relationship between Ta Content and Etching Rate)

The Si substrate on which the absorber layer had been deposited was etched using an ICP plasma etching apparatus. Chlorine (Cl2) gas was used as an etching gas. The ICP source power was 100 W, and the bias power was 40 W. The thicknesses of the absorber layer and TaN film were measured by XRR. The thickness of the absorber layer after the etching was measured to determine the etching rate of the absorber layer. The results of the etching rate are shown in FIG. 16.

[Case 5-2]

The same procedure as in Case 5-1 was conducted, except that an absorber layer was formed using TaN in place of the Sn—Ta alloy. The results of etching rate are shown in FIG. 16.

Figure 16:
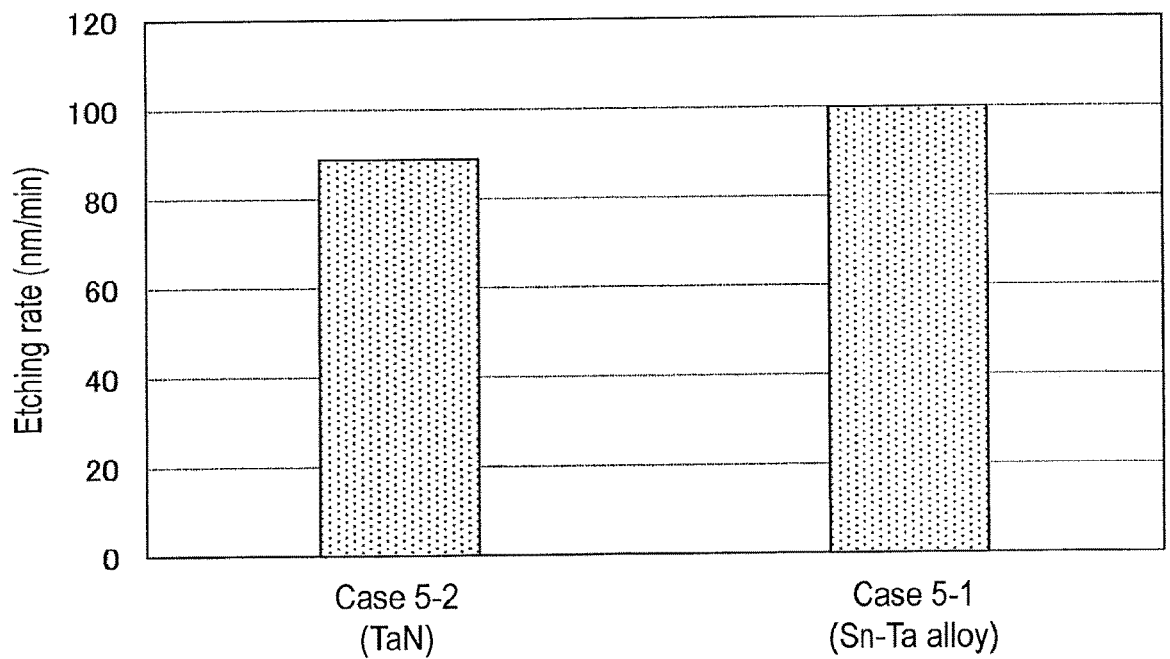
FIG. 16 is a graph showing the measured results of an etching rate of an absorber layer and TaN.

As shown in FIG. 16, the absorber layer in Case 5-1 had a higher etching rate than that in Case 5-2. The absorber layer formed using an Sn—Ta alloy including 70 at % Sn and 30 at % Ta can be more easily etched with Cl2 gas than absorber layers constituted of conventional materials such as TaN. This absorber layer hence is easily processed by etching.

<Case 6>

Case 6 is a working example according to the present invention.

(Production of Reflective Mask Blank)

A reflective mask blank was produced in the same manner as in Case 1-1. Thereafter, a stabilizing layer constituted of TaO was deposited to have a thickness of about 4 nm on the absorber layer by magnetron sputtering. Thus, the reflective mask blank 10B shown in FIG. 9 was produced.

(Measurement of Reflectance)

EUV light having a wavelength of 13.53 nm was allowed to enter the surface of the produced reflective mask blank from the upper side of the reflective mask blank (from the +Z axis direction) at an incidence angle of 6°, and the reflectance to the EUV light reflected by the reflective mask blank was measured. As a result, in the portion where the total thickness of the absorber layer and the stabilizing layer was 40 nm, the EUV light reflectance was about 0.8%.

It was thus found that even in the reflective mask blank in which the total thickness of the absorber layer and the stabilizing layer is about 40 nm, an EUV light reflectance of 1% or less can be attained. Consequently, reflective mask blanks according to this embodiment can attain a larger reduction in absorber-layer thickness than the cases of conventional reflective mask blanks.

<Case 7>

Case 7 is a working example according to the present invention.

(Production of Reflective Mask Blank)

A reflective mask blank was produced in the same manner as in Case 1-1; the glass substrate had a coefficient of thermal expansion of $0.02 \times 10^{-7}/°$ C. or less and the absorber layer (absorber film) was deposited to have a thickness of 40 nm. Thereafter, a preventive layer constituted of Ta was deposited to have a thickness of 2 nm on the absorber layer (absorber film) by magnetron sputtering, and a stabilizing layer constituted of TaO was further deposited to have a thickness of 2 nm on the preventive layer by reactive sputtering. Thus, the reflective mask blank 10C shown in FIG. 11 was produced. In the deposition of the preventive layer by magnetron sputtering, Ar gas was used as a sputtering gas. In the deposition of the stabilizing layer by reactive sputtering, a mixed gas obtained by mixing Ar and oxygen was used as a sputtering gas. The flow rate of Ar was 40 sccm and the flow rate of oxygen was 30 sccm.

The preventive layer and stabilizing layer of the reflective mask blank obtained through the deposition were examined by XRR. As a result, the Ta and the TaO were found to have film thicknesses of 0.9 nm and 4.6 nm, respectively. This is thought to be because during the deposition of the TaO film on the Ta film, the oxygen contained in the sputtering gas reacted with some of the Ta of the Ta film to form a TaO film and an expansion thus occurred.

Thereafter, the reflective mask blank 10C shown in FIG. 11 was dry-etched using a dry-etching apparatus. In the dry etching, an F-based gas was used to remove the preventive layer and the stabilizing layer, and a Cl-based gas was then used to remove the absorber layer.

(Observation of Surface of the Reflective Mask Blank)

The surface of the reflective mask blank was observed with a scanning electron microscope (Ultra 60, manufactured by Carl Zeiss GmbH). As a result, precipitates such as fine particles were not observed. In this case, Ar was only used as the sputtering gas for depositing the preventive layer. Because of this, the surface of the absorber layer was not exposed to any oxygen-containing atmosphere, and thus, the Sn present in the surface of the absorber layer did not react with oxygen. Thus, the surface of the absorber layer was inhibited from undergoing precipitate formation thereon.

Although the embodiments were explained above, these embodiments are mere examples and should not be construed as limiting the scope of the present invention. The embodiments described above can be carried out in other various modes. The embodiments described above can be variously combined and various omissions, replacements, modifications or the like are possible therein, within the spirit of the present invention. These embodiments and modifications are included in the scope and spirit of the present invention, and are equal in scope to the present invention described in the claims.

This application is based on Japanese Patent Application No. 2017-181785 filed on Sep. 21, 2017 and Japanese Patent Application No. 2018-112600 filed on Jun. 13, 2018, the entire subject matters of which are incorporated herein by reference.

DESCRIPTION OF REFERENCE NUMERALS AND SIGNS 10A to 10C Reflective mask blanks
11 Substrate
12 Reflective layer
13 Protective layer
14 Absorber layer
15 Surface oxide film (passive film)
16 Hard mask layer
17 Backside conductive layer
18 Resist layer
19 Stabilizing layer
20 Reflective mask
21 Preventive layer

The invention claimed is:

1. A reflective mask blank comprising, on/above a substrate in the following order from the substrate side:
a reflective layer which reflects EUV light; and
an absorber layer which absorbs EUV light,
wherein the absorber layer is an alloy comprising Sn as a main component and Ta in an amount of 25 at % or more.

2. The reflective mask blank according to claim 1, wherein the absorber layer comprises Sn in an amount of 30 at % or more.

3. The reflective mask blank according to claim 1, wherein the absorber layer has a thickness of 40 nm or less.

4. The reflective mask blank according to claim 1, wherein the absorber layer has a rate of etching with a sulfuric acid hydrogen peroxide mixture being 0.10 nm/min or less.

5. The reflective mask blank according to claim 1, wherein the absorber layer further comprises one or more elements selected from the group consisting of N, O, B, Hf, Si, Zr, Ge, Pd, and H.

6. The reflective mask blank according to claim 1, which comprises a stabilizing layer on/above the absorber layer.

7. The reflective mask blank according claim 6, wherein the stabilizing layer comprises one or more compounds selected from the group consisting of oxides, nitrides, borides, oxynitrides, and oxyborides, each containing Ta and Sn, oxides of Ta, nitrides of Ta, borides of Ta, oxynitrides of Ta, oxyborides of Ta, and Ru-based materials containing Ru.

8. The reflective mask blank according to claim 6, wherein the stabilizing layer has a thickness of 10 nm or less.

9. The reflective mask blank according to claim 6, which comprises a preventive layer on/above the absorber layer.

10. The reflective mask blank according to claim 9, which comprises the preventive layer between the absorber layer and the stabilizing layer.

11. The reflective mask blank according to claim 9, wherein the preventive layer comprises one or more elements selected from the group consisting of Ta, Cr, and Si.

12. The reflective mask blank according to claim 11, wherein the preventive layer comprises one or more components selected from the group consisting of Ta simple substance, Cr simple substance, Si simple substance, nitrides of Ta, nitrides of Cr, nitrides of Si, borides of Ta, borides of Cr, borides of Si, and boronitrides of Ta.

13. The reflective mask blank according to claim 9, wherein the preventive layer comprises one or more elements selected from the group consisting of He, Ne, Ar, Kr, and Xe.

14. The reflective mask blank according to claim 9, wherein the preventive layer has a thickness of 10 nm or less.

15. The reflective mask blank according to claim 1, which comprises a protective layer between the reflective layer and the absorber layer.

16. The reflective mask blank according to claim 1, which comprises a hard mask layer on the absorber layer or as the outermost layer above the absorber layer.

17. The reflective mask blank according to claim 16, wherein the hard mask layer comprises at least one element selected from the group consisting of Cr and Si.

18. A reflective mask obtained by forming a pattern in the absorber layer of the reflective mask blank according to claim 1.

19. A process for producing a reflective mask blank comprising, on/above a substrate in the following order from the substrate side, a reflective layer which reflects EUV light and an absorber layer which absorbs EUV light,
the process comprising:
forming the reflective layer on/above the substrate: and
forming the absorber layer on/above the reflective layer, wherein the absorber layer is an alloy comprising Sn as a main component and Ta in an amount of 25 at % or more.

* * * * *